(12) United States Patent
Kim et al.

(10) Patent No.: US 9,501,165 B2
(45) Date of Patent: Nov. 22, 2016

(54) ORGANIC LIGHT EMITTING DIODE DISPLAY DEVICE WITH TOUCH SCREEN AND METHOD OF FABRICATING THE SAME

(71) Applicant: LG Display Co., Ltd., Seoul (KR)

(72) Inventors: Hyoung-Su Kim, Paju-si (KR); Bu-Yeol Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 108 days.

(21) Appl. No.: 14/582,057

(22) Filed: Dec. 23, 2014

(65) Prior Publication Data

US 2015/0185942 A1  Jul. 2, 2015

(30) Foreign Application Priority Data

Dec. 26, 2013 (KR) .......................... 10-2013-0163901

(51) Int. Cl.
G06F 3/041 (2006.01)
H01L 27/32 (2006.01)
G06F 3/044 (2006.01)

(52) U.S. Cl.
CPC ............. *G06F 3/0412* (2013.01); *G06F 3/044* (2013.01); *H01L 27/323* (2013.01); *G06F 2203/04103* (2013.01)

(58) Field of Classification Search
CPC ................. G06F 3/044; G06F 3/0412; G06F 2203/04111; H01L 27/32; H01L 27/323
See application file for complete search history.

(56) References Cited

U.S. PATENT DOCUMENTS

2008/0062140 A1* 3/2008 Hotelling ............. G09G 3/3648
345/173
2008/0174574 A1* 7/2008 Yoo ....................... G09G 3/3233
345/204
2011/0316802 A1* 12/2011 Choi ....................... G06F 3/041
345/173
2013/0044074 A1  2/2013 Park et al.
2013/0169558 A1* 7/2013 Min ........................ G06F 3/044
345/173
2013/0188103 A1* 7/2013 Jeng ....................... G06F 3/041
349/12
2014/0016043 A1* 1/2014 Chen ....................... G06F 3/041
349/12
2014/0049522 A1* 2/2014 Mathew ............. H05B 33/0896
345/204
2014/0375907 A1* 12/2014 Wu ....................... G06F 3/0412
349/12

OTHER PUBLICATIONS

Keiper, B. et al., "Drilling of Glass by Excimer Laser Mask Projection Technique," *ICALEO 1999*, seven pages.

* cited by examiner

*Primary Examiner* — Quan-Zhen Wang
*Assistant Examiner* — Xuemei Zheng
(74) *Attorney, Agent, or Firm* — Fenwick & West LLP

(57) ABSTRACT

An OLED display device with a touch screen includes first and second substrates; organic light emitting diodes in the display area over the first substrate; first pads and second pads in the non-display area over the first substrate; first and second touch electrodes in the display area over the second substrate; touch pads in the non-display area over the second substrate and corresponding to and overlapping the second pads, respectively; and a first adhesive layer between the first and second substrates and exposing the first and second pads, wherein pad contact holes pass through the second substrate, the touch pads, and the first adhesive layer and expose the second pads, respectively, and wherein a conduction means is disposed in each of the pad contact holes and electrically connects each of the touch pads with a corresponding second pad.

22 Claims, 16 Drawing Sheets

ORGANIC LIGHT EMITTING DIODE DISPLAY DEVICE WITH TOUCH SCREEN AND METHOD OF FABRICATING THE SAME

CROSS-REFERENCE TO RELATED APPLICATION

The present application claims the priority benefit of Korean Patent Application No. 10-2013-0163901 filed in the Republic of Korea on Dec. 26, 2013, which is hereby incorporated by reference in its entirety.

BACKGROUND

Field of the Disclosure

The present disclosure relates to an organic light emitting diode display device with a touch screen, and more particularly, to an organic light emitting diode display device with a touch screen in which a display panel and a touch screen are connected to an external driving circuit board via a flexible printed circuit board (FPC) connector and a method of fabricating the same.

Discussion of the Related Art

Organic light emitting diode (OLED) display devices of flat panel displays, which may be referred to as organic electroluminescent display devices, have high brightness and low driving voltages. In addition, because they are self-luminous, OLED display devices have excellent contrast ratios and ultra thin profile. OLED display devices have a response time of several micro seconds, and there are advantages in displaying moving images. OLED display devices have wide viewing angles and are stable under low temperatures. OLED display devices may be driven by a low voltage of direct current (DC) of 5V to 15V, so it is possible to design and manufacture driving circuits without high-voltage components.

Accordingly, OLED display devices are widely used for various applications such as televisions, monitors, mobile phones, and personal digital assistants (PDAs), for example.

Recently, many products have been produced and have attracted users' attentions where a touch sensor is built in portable mobile devices, PDAs, and notebooks and operation is performed according to a touch on a screen.

With these trends, OLED display devices having touch functions have been suggested and developed.

FIG. 1 is a cross-sectional view of an OLED display device 5 with a touch screen according to the related art.

In FIG. 1, an OLED panel 12 includes an organic light emitting diode E and displays an image. The organic light emitting diode E includes a first electrode 47, an organic light emitting layer 55, and a second electrode 58. A touch screen 80, which includes touch electrodes 83 and 86 and senses a change in capacitance when there is a touch, is attached to a surface of the OLED panel 12 to detect the touch. The touch electrodes 83 and 86 cross each other with an insulating layer 85 therebetween.

However, the OLED display device 5 with the touch screen includes a first flexible printed circuit board (FPC) connector 99a to connect the OLED panel 12 to an external driving circuit board (not shown) and further needs a second FPC connector 99b to connect the touch screen 80 to the external driving circuit board.

Since the OLED display device 5 has two FPC connects 99a and 99b for the OLED panel 12 and the touch screen 80, component costs increase and a thickness of the OLED display device 5 increases.

In addition, to correctly connect the FPC connectors 99a and 99b with a main board, which is included in a final product such as a mobile device or a PDA, the design of the final product considers positions and lengths of connectors on the main board, which are connected to the FPC connectors 99a and 99b, respectively. Therefore, the multiple FPC connectors 99a and 99b increase constraints in designing the final product.

SUMMARY

Accordingly, the present invention is directed to an organic light emitting diode display device with a touch screen and a method of fabricating the same that substantially obviate one or more of the problems due to limitations and disadvantages of the related art.

An object of the present disclosure is to provide an organic light emitting diode display device with a touch screen and a method of fabricating the same that decrease the number of components and manufacturing costs and have light weight and a thin profile.

Additional features and advantages are set forth in the description which follows, and in part may be apparent from the description, or may be learned by practice of the invention. The objectives and other advantages are realized and attained by the structure particularly pointed out in the written description and claims hereof as well as the appended drawings.

To achieve these and other advantages, as embodied and broadly described herein, there is provided an organic light emitting diode display device with a touch screen including first and second substrates where a display area including pixel regions and a non-display area at an outside of the display area are defined; organic light emitting diodes in the display area over the first substrate; first pads and second pads in the non-display area over the first substrate; first and second touch electrodes in the display area over the second substrate; touch pads in the non-display area over the second substrate and corresponding to and overlapping the second pads, respectively; and a first adhesive layer between the first and second substrates and exposing the first and second pads, wherein pad contact holes pass through the second substrate, the touch pads and the first adhesive layer and expose the second pads, respectively, and wherein a conduction means is disposed in each of the pad contact holes and electrically connects each of the touch pads with a corresponding second pad.

In another aspect, a method of fabricating an organic light emitting diode display device includes forming organic light emitting diodes in a display area over a first substrate, the display area including pixel regions; forming first pads and second pads in a non-display area over the first substrate, the non-display area disposed at an outside of the display area; forming first and second touch electrodes in the display area and touch pads in the non-display area over a second substrate, the first and second touch electrodes crossing each other, and the touch pads connected to the first and second touch electrodes and corresponding to and overlapping the second pads, respectively; attaching the first substrate and the second substrate with a first adhesive layer interposed therebetween, the first adhesive layer exposing the first and second pads; forming pad contact holes by irradiating with a laser beam, the pad contact holes passing through the second substrate, the touch pads and the first adhesive layer and exposing the second pads, respectively; and forming a conduction means by applying and curing a metal paste in each of the pad contact holes, the conduction means electrically connecting each of the touch pads with a corresponding second pad.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference is now made in detail to the various embodiments, examples of which are illustrated in the accompanying drawings.

Figure 1:
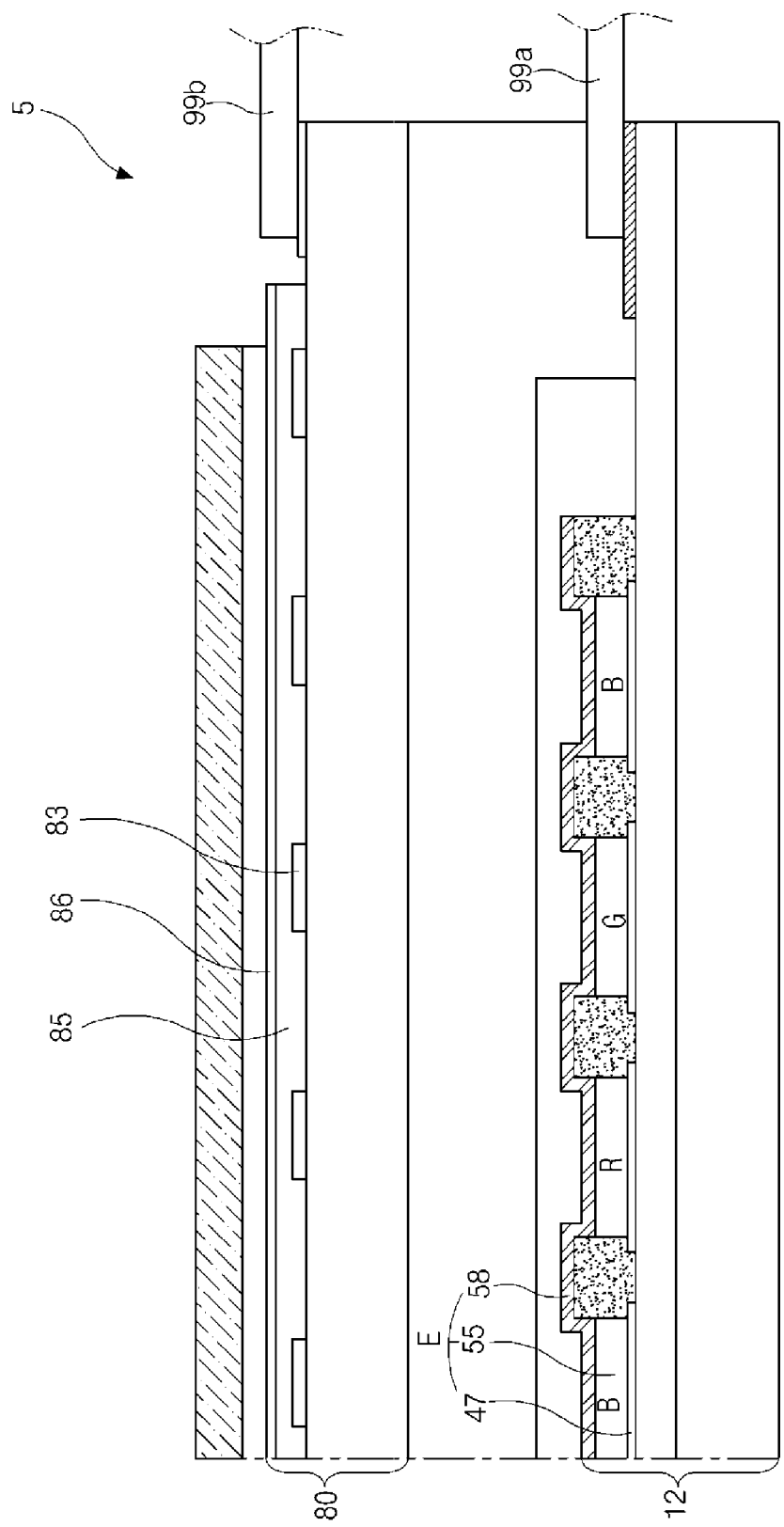
FIG. 1 is a cross-sectional view of an OLED display device with a touch screen according to the related art.
Figure 2:
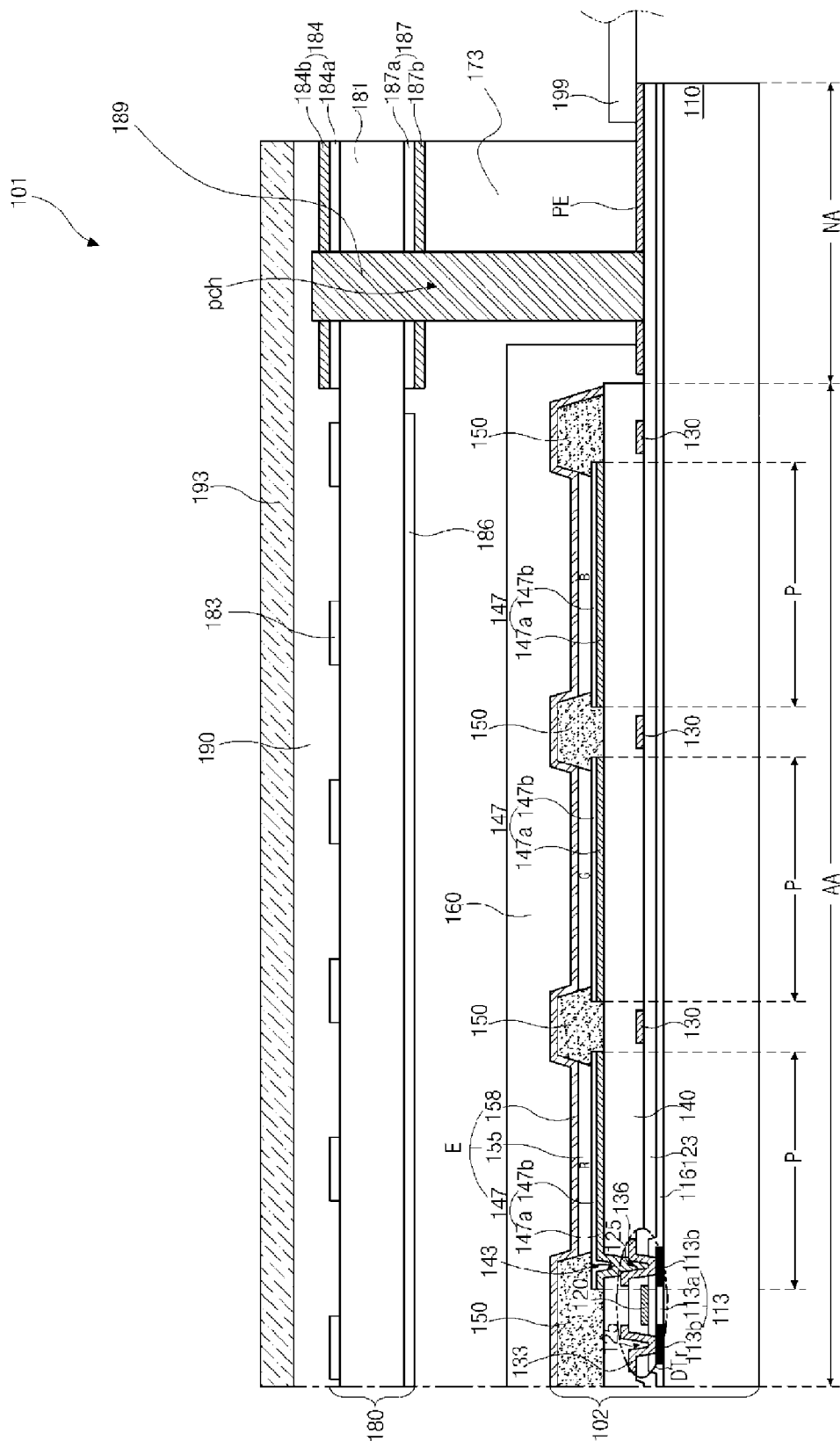
FIG. 2 is a cross-sectional view of an OLED display device with a touch screen according to a first embodiment of the present invention.

FIG. 2 is a cross-sectional view of an OLED display device 101 with a touch screen 180 according to a first embodiment of the present invention. For convenience of explanation, a display area AA and a non-display area NA are defined. An image is displayed in the display area AA, and a plurality of first pads (not shown) and a plurality of second pads PE are disposed in the non-display area NA at the outside of the display area AA.

In FIG. 2, an OLED display device 101 with a touch screen 180 according to the first embodiment includes a display panel 102, an encapsulation film 160, and a touch screen 180. The display panel 102 is an OLED panel and includes a switching thin film transistor (not shown), a driving thin film transistor DTr, and an organic light emitting diode E in each pixel region P. The organic light emitting diodes E in the pixel regions P sequentially emit red, green, and blue light. The encapsulation film 160 protects the organic light emitting diodes E. The touch screen 180 is attached to the encapsulation film 160 via a first adhesive layer 173.

The OLED display device 101 may further include a polarizing film 193 at an outer surface of the touch screen 180 to prevent reflection due to external light. Alternatively, the polarizing film 193 may be omitted, and instead, a cover glass may be disposed on the outer surface of the touch screen 180.

The display panel 102 is described in more detail below. For convenience of explanation, switching and driving areas, where the switching thin film transistor and the driving thin film transistor DTr are formed, respectively, are defined in each pixel region P. Although the driving thin film transistor DTr is shown in one pixel region P, the driving thin film transistor DTr is formed in each of the pixel regions P. Data lines 130 are disposed between adjacent pixel regions P.

The display panel 102 includes a first substrate 110, and a semiconductor layer 113 is formed in each pixel region P on the first substrate 110. The semiconductor layer 113 includes a first area 113a of intrinsic polycrystalline silicon at a center and second areas 113b of impurity-doped polycrystalline silicon at both sides of the first area 113a. The first area 113a forms a channel of a thin film transistor.

A buffer layer (not shown) may be further formed between the semiconductor layer 113 and the first substrate 110 substantially all over the first substrate 110. The buffer layer may be formed of an inorganic insulating material such as silicon oxide ($SiO_2$), silicon nitride (SiNx), or a combination thereof, for example.

The buffer layer prevents alkali ions in the first substrate 110 from moving into the semiconductor layer 113 when the semiconductor layer 113 is crystallized and prevents the semiconductor layer 113 from being degraded due to the alkali ions.

A gate insulating layer 116 covers the semiconductor layer 113 and is formed over substantially all the first substrate 110. A gate electrode 120 is formed on the gate insulating layer 116 corresponding to the first area 113a of the semiconductor layer 113.

In addition, gate lines (not shown) are formed on the gate insulating layer 116. The gate lines extend in a direction, and each gate line is connected to a gate electrode (not shown) of a switching thin film transistor (not shown).

The gate electrode 120 of the driving thin film transistor DTr, the gate electrode (not shown) of the switching thin film transistor, and the gate lines (not shown) are formed of a metallic material having relatively low resistivity such as aluminum (Al), aluminum alloy (e.g., AlNd), copper (Cu), copper alloy, molybdenum (Mo), and molybdenum alloy (e.g., MoTi), for example. The gate electrode 120 of the driving thin film transistor DTr, the gate electrode (not shown) of the switching thin film transistor, and the gate lines (not shown) may include one or two more of the above-mentioned materials and may have a single-layered structure or a multiple-layered structure.

An inter insulating layer 123 is formed on the gate electrode 120 of the driving thin film transistor DTr, the gate electrode (not shown) of the switching thin film transistor (not shown), and the gate lines (not shown) over substantially all the first substrate 110. The inter insulating layer 123 and the gate insulating layer 116 thereunder include semiconductor contact holes 125 exposing the second areas 113b at both sides of the first area 113a, respectively.

Data lines 130 are formed on the inter insulating layer 123 including the semiconductor contact holes 125. The data lines 130 cross the gate lines (not shown) to define the pixel regions P.

In addition, source and drain electrodes 133 and 136 are formed in each of the driving area and the switching area on the inter insulating layer 123. The source and drain electrodes 133 and 136 are spaced apart from each other and contact the second areas 113b through the semiconductor contact holes 126, respectively.

The driving thin film transistor DTr comprises the source and drain electrodes 133 and 136, the semiconductor layer 113, the gate insulating layer 116 on the semiconductor layer 113, and the gate electrode 120. The switching thin film transistor (not shown) has the same structure as the driving thin film transistor DTr.

The data lines 130 and the source and drain electrodes 133 and 136 are also formed of a metallic material having relatively low resistivity such as aluminum (Al), aluminum alloy (e.g., AlNd), copper (Cu), copper alloy, molybdenum (Mo), and molybdenum alloy (e.g., MoTi), for example. The data lines 130 and the source and drain electrodes 133 and 136 may include one or two more of the above-mentioned materials and may have a single-layered structure or a multiple-layered structure.

The switching thin film transistor (not shown) is electrically connected to the driving thin film transistor DTr, one gate line (not shown) and one data line 130. The data line 130 is connected to the source electrode (not shown) of the switching thin film transistor (not shown), and the driving thin film transistor DTr is connected to a power supply line (not shown) and the organic light emitting diode E.

In the OLED display device 101 according to the first embodiment, the driving thin film transistor DTr and the switching thin film transistor (not shown) include the semiconductor layer 113 of polycrystalline silicon and have a top gate type. Alternatively, the driving thin film transistor DTr and the switching thin film transistor (not shown) may include a semiconductor layer of amorphous silicon or an oxide semiconductor material and have a bottom gate type.

The driving thin film transistor and the switching thin film transistor having the bottom gate type may include a gate electrode, a gate insulating layer, an active layer of intrinsic amorphous silicon, ohmic contact layers of impurity-doped amorphous silicon spaced apart from each other, and source and drain electrodes spaced apart from each other or may include a gate electrode, a gate insulating layer, an oxide semiconductor layer, an etch stopper, and source and drain electrodes spaced apart from each other on the etch stopper and contacting the oxide semiconductor layer.

When the driving thin film transistor and the switching thin film transistor having the bottom gate type are formed on the first substrate, the gate line is formed on the same layer as and is connected to the gate electrode of the switching thin film transistor, and the data line is formed on the same layer as and is connected to the source electrode of the switching thin film transistor.

Although not shown in the figure, the power supply line (not shown) is formed on the same layer as the gate line (not shown) or as the data line 130, and the power supply line (not shown) is connected to an electrode of the driving thin film transistor DTr.

A first electrode 147 is formed on the inter insulating layer 123 in each pixel region P, and the first electrode 147 contacts the drain electrode 136 of the driving thin film transistor DTr. The first electrode 147 has a double-layered structure including a first layer 147a as a reflector and a second layer 147b as an anode.

Namely, the second layer 147b, which functions as an anode, may formed of a transparent conductive material having relatively high work function such as indium tin oxide or indium zinc oxide, for example. The first layer 147a, which serves as a reflector, may be formed of a metallic material having relatively high reflectance such as aluminum (Al) or silver (Ag), for example, and reflects light emitted from an organic light emitting layer 155, which is formed on the first electrode 147 to increase luminous efficiency.

As an example, the display panel 102 of the OLED display device 101 with a touch screen 180 according to the first embodiment is a type emission type. Here, light emitted from the organic light emitting layer 155 toward the first substrate 110 of the display panel 102 is not substantially perceived by a user and disappears. To redirect the light, improve brightness, and simplify manufacturing processes, the first electrode 147 includes the first layer 147a of a metallic material having relatively high reflectance and has a double-layered structure.

The display panel 102 of the OLED display device 101 may be a bottom emission type. In this case, the first electrode 147 has a single-layered structure of a transparent conductive material having relatively high work function.

A bank 150 is formed on the first electrode 147 between the pixel regions P. The bank 150 surrounds each pixel region P, overlaps edges of the first electrode 147, and exposes a central portion of the first electrode 147.

The bank 150 may be formed of a transparent organic insulating material. For example, the transparent organic insulating material may be one of polyimide, photo acryl and benzocyclobutene (BCB). Alternatively, the bank 150 may be formed of a black material such as black resin, for example.

The bank 150 has a lattice shape surrounding each pixel region P in the display area AA.

The organic light emitting layer 155 emitting red, green, or blue light is formed on the first electrode 147 in each pixel region P surrounded by the bank 150.

The organic light emitting layer 155 may further emit white light. Accordingly, the organic light emitting layers 155 in the pixel regions P may emit red light, green light, blue light, and white light, respectively.

In the figure, the organic light emitting layers 155 emit red light, green light, and blue light, respectively, for example.

A second electrode 158 is formed on the organic light emitting layer 155 substantially all over the display area AA. The second electrode 158 functions as a cathode and is transparent. The organic light emitting diode E comprises the first and second electrodes 147 and 158 and the organic light emitting layer 155 therebetween.

Although not shown in the figure, to improve the luminous efficiency of the organic light emitting layer 155, a first luminosity compensation layer (not shown) may be formed between the first electrode 147 and the organic light emitting layer 155, and a second luminosity compensation layer (not shown) may be formed between the organic light emitting layer 155 and the second electrode 158.

Each of the first luminosity compensation layer and the second luminosity compensation layer may have a double-layered structure. The first luminosity compensation layer may include a hole injection layer and a hole transporting layer sequentially layered on the first electrode 147. The second luminosity compensation layer may include an electron transporting layer and an electrode injection layer sequentially layered on the organic light emitting layer 155.

Alternatively, each of the first luminosity compensation layer and the second luminosity compensation layer may have a single layered structure. Namely, the first luminosity compensation layer may include the hole injection layer or the hole transporting layer, and the second luminosity compensation layer may include the electron transporting layer or the electron injection layer.

The first luminosity compensation layer may further include an electron blocking layer, and the second luminosity compensation layer may further include a hole blocking layer.

The second electrode 158 formed on the organic light emitting layer 155, which functions as a cathode, may be formed of a metallic material having relatively low work function. The metallic material may be one or more of aluminum (Al), aluminum alloy (e.g., AlNd), silver (Ag), magnesium (Mg), gold (Au), and aluminum and magnesium alloy (e.g., AlMg), for example.

The encapsulation film 160 is attached onto the organic light emitting diode E to protect the organic light emitting diode E and to prevent permeation of moisture. Alternatively, an encapsulation layer in which inorganic layers and organic layers are alternately disposed may be formed on the organic light emitting diode E. The encapsulation film 160 is disposed in the display area AA and part of the non-display area NA. The encapsulation layer 160 exposes the first pads (not shown) and the second pads PE. The encapsulation layer 160 may partially overlap the first pads (not shown) and the second pads PE.

In the non-display area NA of the display panel 102, the first pads (not shown) and the second pads PE are formed over the first substrate 110. The first pads (not shown) are connected to respective ends of the gate lines (not shown), the data lines 130 and the power supply lines (not shown) disposed in the display area AA. The second pads PE are spaced apart from the first pads (not shown).

The second pads PE are electrically connected to touch pads 184 and 187, which are connected to first and second touch electrodes 183 and 186 of the touch screen 180. The second pads PE are formed over the first substrate 110 of the display panel 102, and the first pads (not shown) and the second pads PE are connected to one FPC connector 199.

The touch screen 180 is attached to the encapsulation film 160 over the display panel 102 via the first adhesive layer 173. The touch screen 180 includes a second substrate 181 and the first and second touch electrodes 183 and 186 on the second substrate 181. The second substrate 181 may be a flexible film formed of plastic or a polymer material. The first and second touch electrodes 183 and 186 are formed on opposite surfaces of the second substrate 181, respectively, and the first and second touch electrodes 183 and 186 cross each other. Here, the second substrate 181 is used as an insulating layer between the first and second touch electrodes 183 and 186.

That is, the first touch electrodes 183 are formed on an outer surface of the second substrate 181 corresponding to the display area AA. The first touch electrodes 183 have a bar shape extending in an x-axis direction and are spaced apart from each other along a y-axis direction perpendicular to the x-axis direction. The second touch electrodes 186 are formed on an inner surface of the second substrate 181 corresponding to the display area AA. The second touch electrodes 186 have a bar shape extending in the y-axis direction and are spaced apart from each other along the x-axis direction.

The touch screen 180 senses a change in capacitance between the first and second touch electrodes 183 and 186 adjacent to each other, determines whether or not there is a touch, and enables operations to be performed according to the touch sensed from the change in capacitance.

In the touch screen 180 of the figure, the second substrate 181 is used as an insulating layer, and the first and second touch electrodes 183 and 186 are disposed on outer and inner surfaces of the second substrate 181, respectively. Alternatively, locations and structures of the first and second touch electrodes 183 and 186 may be changed.

Figure 3:
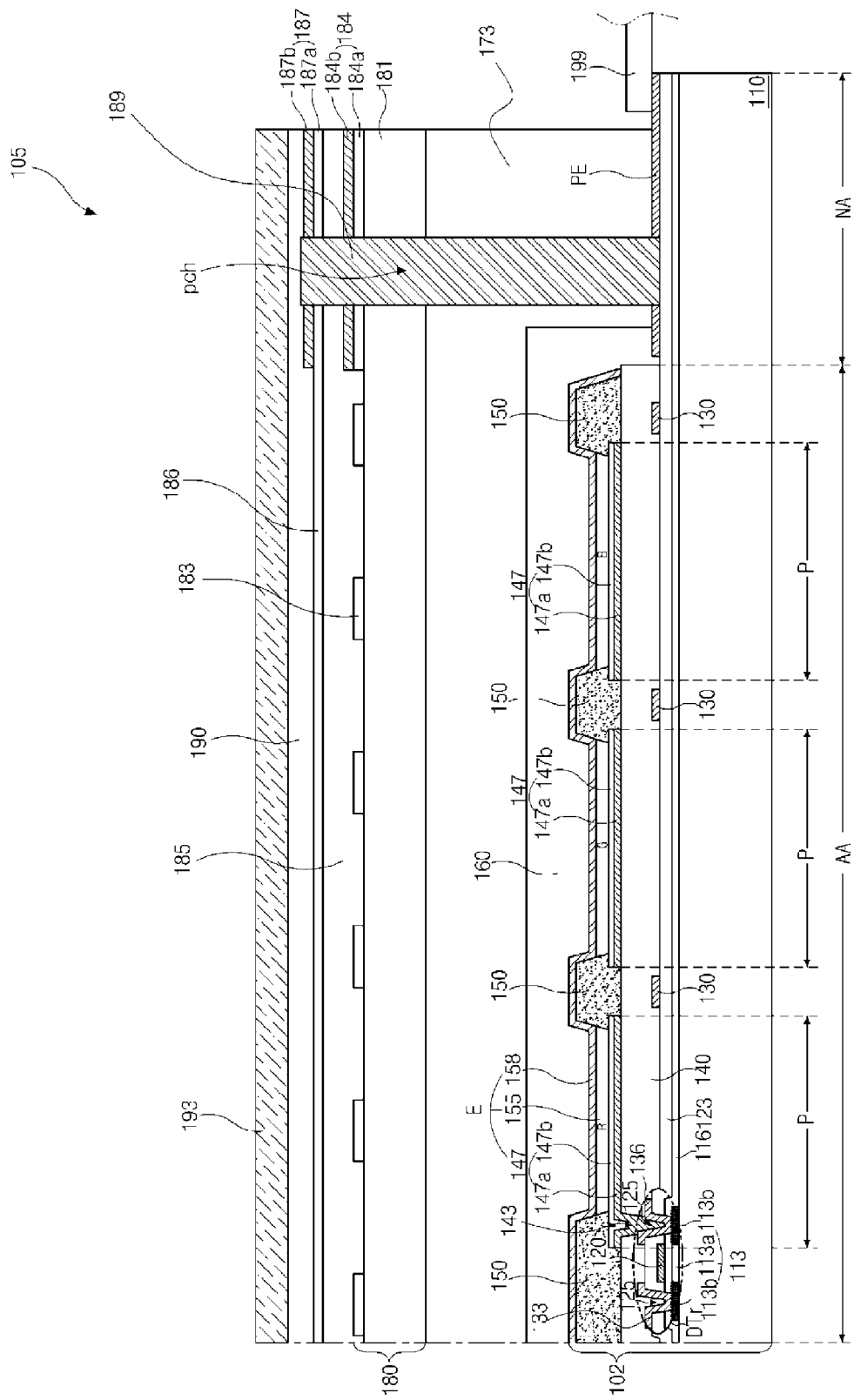
FIG. 3 is a cross-sectional view of another OLED display device with a touch screen according to the first embodiment of the present invention.

Referring to FIG. 3, which is a cross-sectional view of another OLED display device 105 with a touch screen 180 according to the first embodiment, the touch screen 180 may include a second substrate 181 and first and second touch electrodes 183 and 186 on an outer surface of the second substrate 181. More particularly, the first touch electrodes 183 are formed on the outer surface of the second substrate 181, an insulating layer 185 is formed on the first touch electrodes 183, and the second touch electrodes 186 are formed on the insulating layer 185. Alternatively, the first touch electrodes 183 and the second touch electrodes 186 may be formed on an inner surface of the second substrate 181.

Referring to FIG. 2 again, first touch pads 184 are formed in the non-display area NA of the touch screen 180 and connected to ends of the first touch electrodes 183, respectively. In addition, second touch pads (not shown) are formed in the non-display area NA of the touch screen 180 and connected to ends of the second touch electrodes 186, respectively.

First auxiliary touch pads (not shown) may be formed on the same layer as the first touch pads 184 and may correspond to the second touch pads (not shown), respectively. In addition, second auxiliary touch pads 187 may be formed on the same layer as the first touch pads (not shown) and may correspond to the first touch pads 184, respectively. The first touch pads 184 may include a lower layer 184a and an upper layer 184b. The second auxiliary touch pads 187 may include a lower layer 187a and an upper layer 187b.

The first auxiliary touch pads (not shown) and the second auxiliary touch pads 187 are formed to create the same environment in a process of forming holes by irradiation from a laser beam. The first auxiliary touch pads (not shown) and the second auxiliary touch pads 187 may be omitted.

The first touch pads 184 and the second touch pads (not shown) of the touch screen 180 correspond to the second pads PE of the display panel 102, respectively, to electrically connect the first touch pads 184 and the second touch pads (not shown) with the second pads PE through the process of forming the holes by irradiation from a laser beam.

In the OLED display device with a touch screen according to the first embodiment, pad contact holes pch are formed in the touch screen 180 and the first adhesive layer 173, and the pad contact holes pch pass through the second pads PE of the display panel 102 corresponding to the first touch pads 184 and the second touch pads (not shown) of the touch screen 180, respectively.

The pad contact holes pch pass through the first touch pads 184 and the second touch pads (not shown) of the touch screen 180. Alternatively, the pad contact holes pch may not pass through the second pads PE and may expose top surfaces of the second pads PE.

When the first auxiliary touch pads (not shown) and the second auxiliary touch pads 187 are formed in the touch screen 180, the pad contact holes pch may pass through the first auxiliary touch pads (not shown) and the second auxiliary touch pads 187.

The pad contact holes pch pass through the first touch pads 184, the second touch pads (not shown), the first pads (not shown) and the second pads PE because the pad contact holes pch are formed by irradiation from a laser beam. This is described in detail later.

Conduction means 189 are disposed in the pad contact holes pch. The conduction means 189 may be formed of a metal paste having relatively high conductivity such as silver (Ag) paste, for example.

The conduction means 189 of the metal paste in the pad contact holes pch electrically connect the first touch pads 184 of the touch screen 180 and the second pads PE corresponding to the first touch pads 184. In addition, the conduction means 180 electrically connect the second touch pads (not shown) of the touch screen 180 and the second pads PE corresponding to the second touch pads (not shown).

Accordingly, in the OLED display device 101 with a touch screen according to the first embodiment, although one FPC connect 199, which contacts the first pads (not shown) and the second pads PE of the display panel 101, is used, both the display panel 102 and the touch screen 180 may be driven. Thus, since one FPC connector can be omitted as compared with the related art, the number of components is decreased, and manufacturing costs are lowered. Therefore, a selling price of the display device may be reduced.

Moreover, since one FPC connector 199 is used, freedom in design and arrangement, which should be considered to connect the FPC connector 199 with an external driving circuit board (not shown), are improved. Furthermore, an FPC connector of the touch screen 180 is omitted, so the OLED display device 101 with a touch screen may have a light weight and a thin profile.

Hereinafter, a method of fabricating an OLED display device with a touch screen according to the first embodiment is described. Hereinafter, steps of forming the driving thin film transistor DTr, the switching thin film transistor (not shown), and the organic light emitting diodes E are described.

FIGS. 4A to 4G are cross-sectional views of an OLED display device 101 with a touch screen 180 in steps of fabricating the display device according to the first embodiment.

Figure 4A:
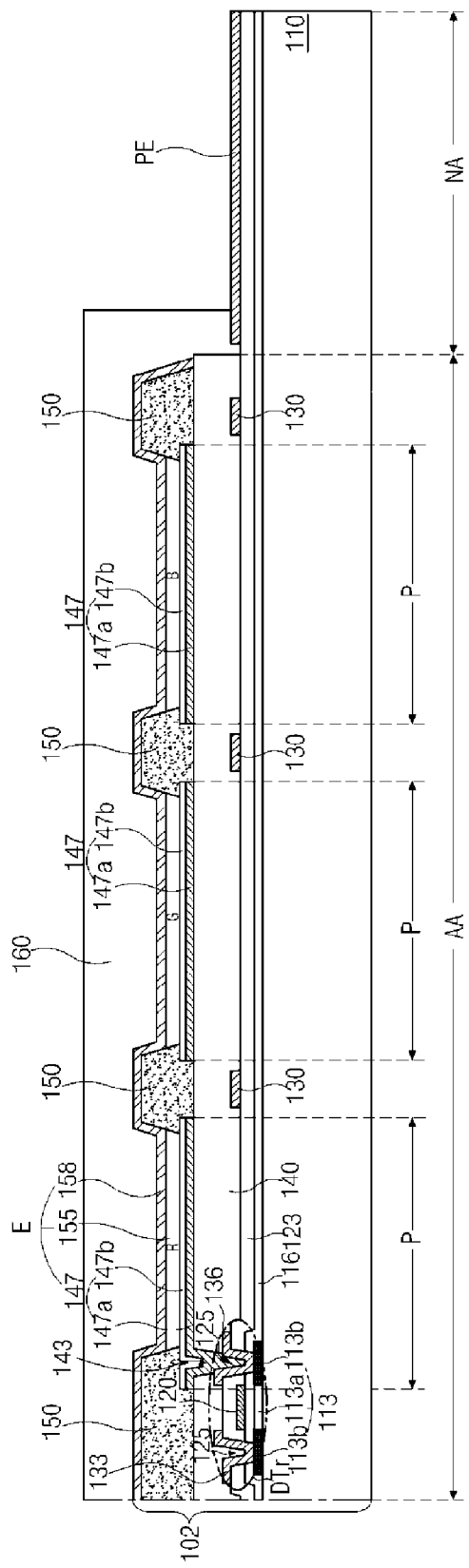
FIGS. 4A to 4G are cross-sectional views of an OLED display device with a touch screen in steps of fabricating the display device according to the first embodiment of the present invention.

In FIG. 4A, the gate lines (not shown) and the data lines 130 are formed over the first substrate 110 in the display area AA. The gate lines (not shown) and the data lines 130 cross each other to define the pixel regions P. The first substrate 110 may be formed of a transparent insulating material and may be a glass substrate or a plastic substrate, for example. The power supply lines (not shown) are also formed over the first substrate 110 in the display area AA and are parallel to the gate lines (not shown) or the data lines 130. The first pads (not shown) and the second pads PE are formed over the first substrate 110 in the non-display area NA. The first pads (not shown) are connected to ends of the gate lines (not shown), the data lines 130, and the power supply lines (not shown). The second pads PE are spaced apart from the first pads (not shown).

The switching thin film transistor (not shown) and the driving thin film transistor DTr are formed in each of the pixel regions P over the first substrate 110. The first electrode 147 connected to the drain electrode 136 of the driving thin film transistor DTr is formed in each of the pixel regions P over the first substrate 110, and the bank 150 overlapping edges of the first electrode 147 is formed on the first electrode 147. The organic light emitting layer 155 and the second electrode 158 are sequentially formed on the first electrode 147 exposed by the bank 150, thereby completing the display panel 102. The encapsulation film 160 is attached to the second electrode 158. The encapsulation film 160 exposes the first pads (not shown) and the second pads PE. The display panel 102 may further include the encapsulation film 160.

An encapsulation layer in which inorganic layers and organic layers are alternately disposed may be formed instead of the encapsulation film 160.

Figure 4B:
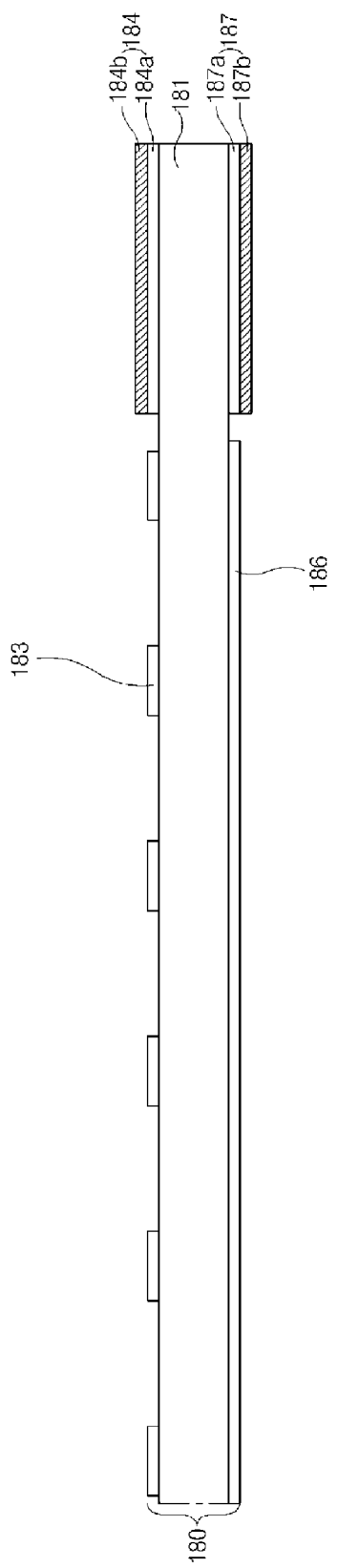

In FIG. 4B, the first touch electrodes 183 are formed on a first surface of the second substrate 181 in the display area AA. The second substrate 181 may be formed of a transparent insulating material. The second substrate 181 may be a flexible film. The first touch electrodes 183 extend in a first direction, for example, the x-axis direction, and are spaced apart from each other along a second direction, for example, the y-axis direction perpendicular to the x-axis direction.

The second touch electrodes 186 are formed on a second surface of the second substrate 181 opposite to the first surface in the display area AA. The second touch electrodes 186 extend in the second direction, that is, the y-axis direction and are spaced apart from each other along the first direction, that is, the x-axis direction.

Alternatively, referring to FIG. 3, the insulating layer 185 may be formed on the first touch electrodes 183 on the first surface of the second substrate 181, and the second touch electrodes 186 may be formed on the insulating layer 185.

The first and second touch electrodes 183 and 186 may be formed of a transparent conductive material such as indium zinc oxide or indium tin oxide, for example.

The first touch pads 184 are formed on the first surface of the second substrate 181 in the non-display area NA, and the second touch pads (not shown) are formed on the second surface of the second substrate 181 in the non-display area NA, thereby completing the touch screen 180. The first touch pads 184 are connected to ends of the first touch electrodes 183, and the second touch pads (not shown) are connected to ends of the second touch electrodes 186. The first touch pads 184 may be formed simultaneously with the first touch electrodes 183, and the second touch pads (not shown) may be formed simultaneously with the second touch pads 186. Alternatively, the first touch pads 184 may be formed after forming the first touch electrodes 183, and the second touch pads (not shown) may be formed after forming the second touch electrodes 186.

Here, the first touch pads 184 and the second touch pads (not shown) may be formed of the same material as the first and second touch electrodes 183 and 186. Alternatively, the first touch pads 184 and the second touch pads (not shown) may be formed of a metallic material having relatively low resistivity and may include one or more of copper (Cu), aluminum (Al), aluminum alloy (e.g., AlNd), molybdenum (Mo), and molybdenum and titanium alloy (e.g., MoTi), for example. The first touch pads 184 may have a double-layered structure of a lower layer 184a and an upper layer 184b. The lower layer 184a may be formed of a transparent conductive material, and the upper layer 184b may be formed of a metallic material having relatively low resistivity. The second touch pads (not shown) also may have a double-layered structure of a lower layer and an upper layer.

In addition, the first auxiliary touch pads (not shown) corresponding to the second touch pads (not shown) may be further formed on the same layer as the first touch pads 184, and the second auxiliary touch pads 187 corresponding to the first touch pads 184 may be further formed on the same layer as the second touch pads (not shown). The second auxiliary touch pads 187 may have a double layered structure of a lower layer 187a and an upper layer 187b.

Figure 4C:
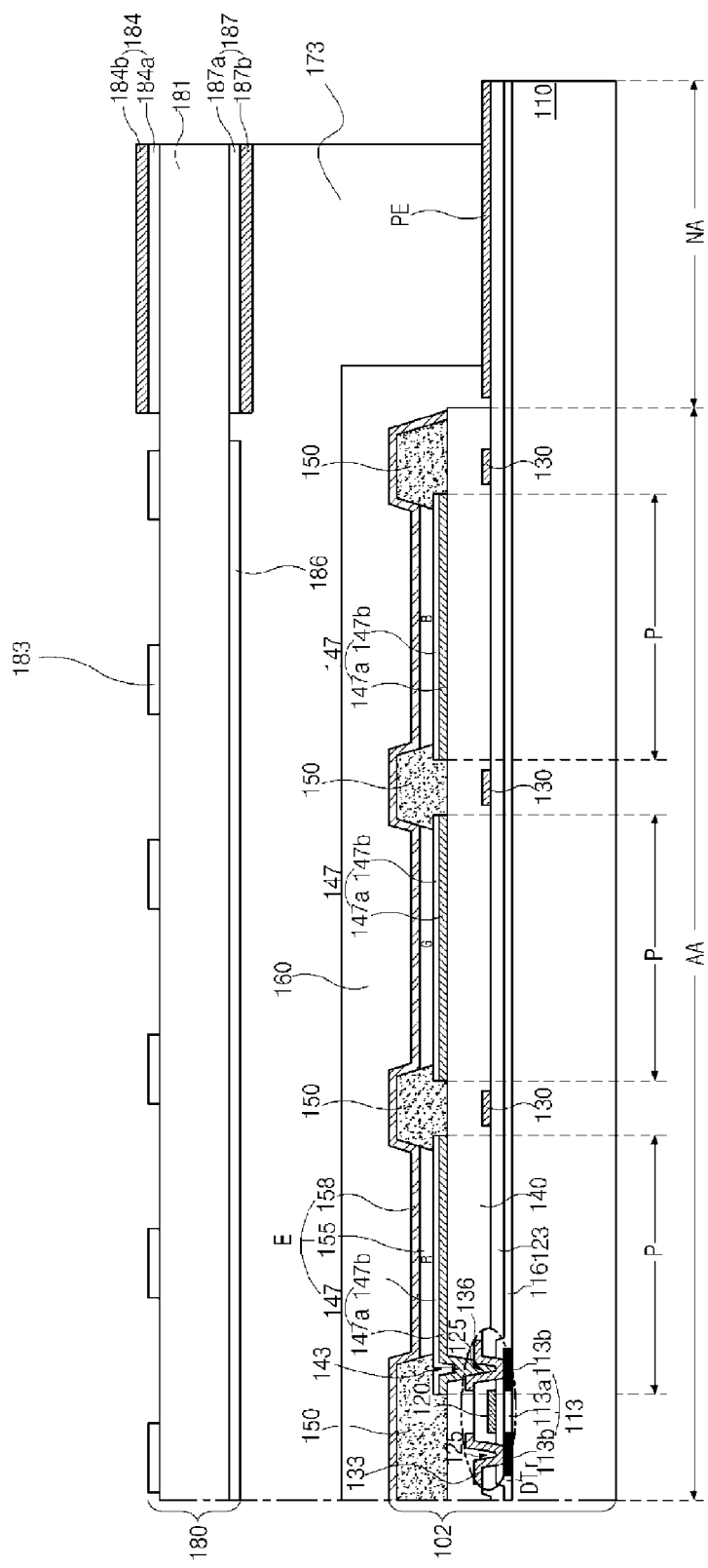

In FIG. 4C, the touch screen 180 is disposed over the display panel 102 including the organic light emitting diode E, and the touch screen 180 is attached to the display panel 102 with the first adhesive layer 173 interposed therebetween. The touch screen 180 may be attached to the encapsulation film 160 on the display panel 102 via the first adhesive layer 173. The first adhesive layer 173 is disposed in the display area AA and part of the non-display area NA, and the first adhesive layer 173 partially exposes the first pads (not shown) and the second pads PE of the display panel 102.

Figure 4D:
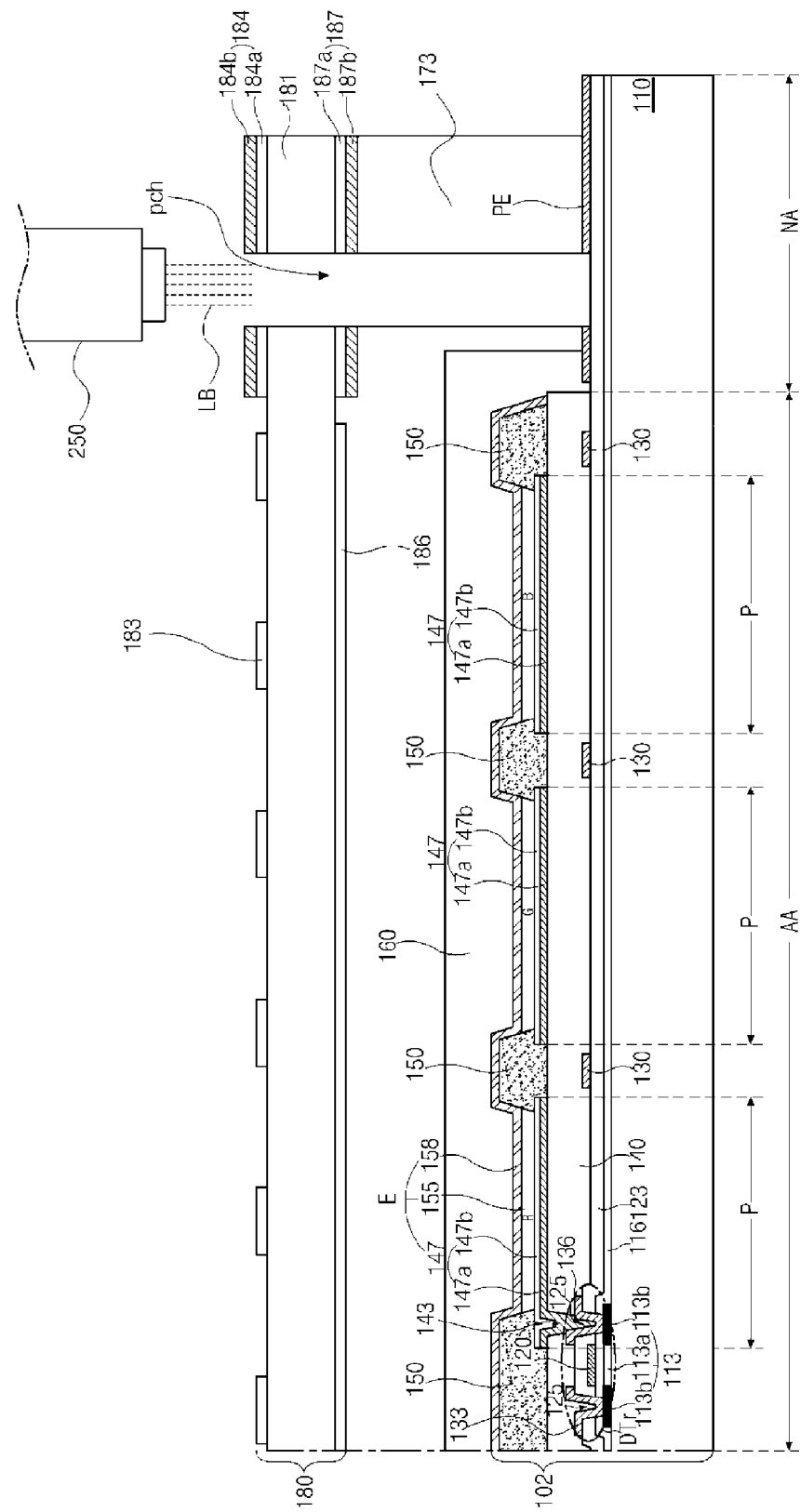
Figure 4E:
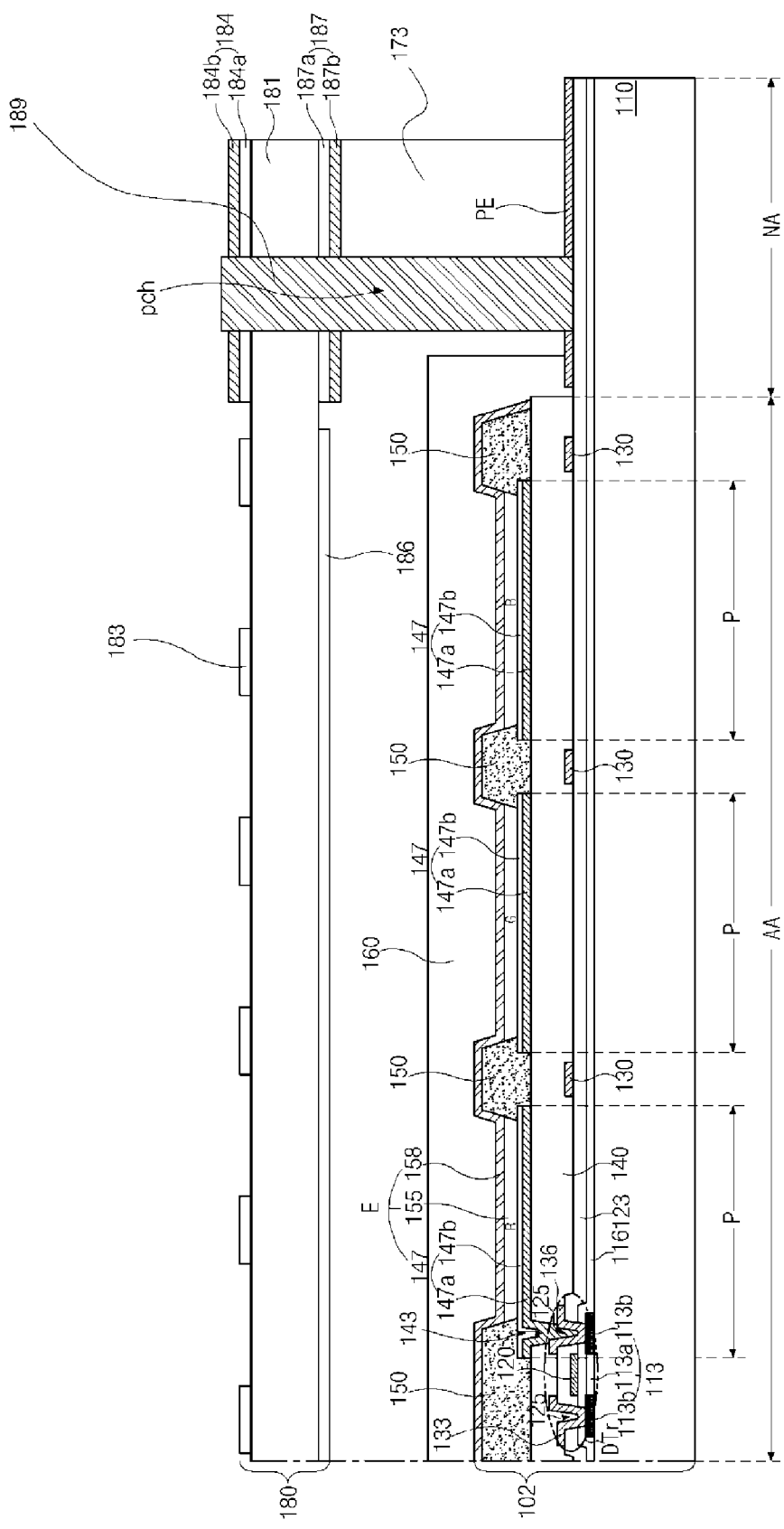
Figure 4F:
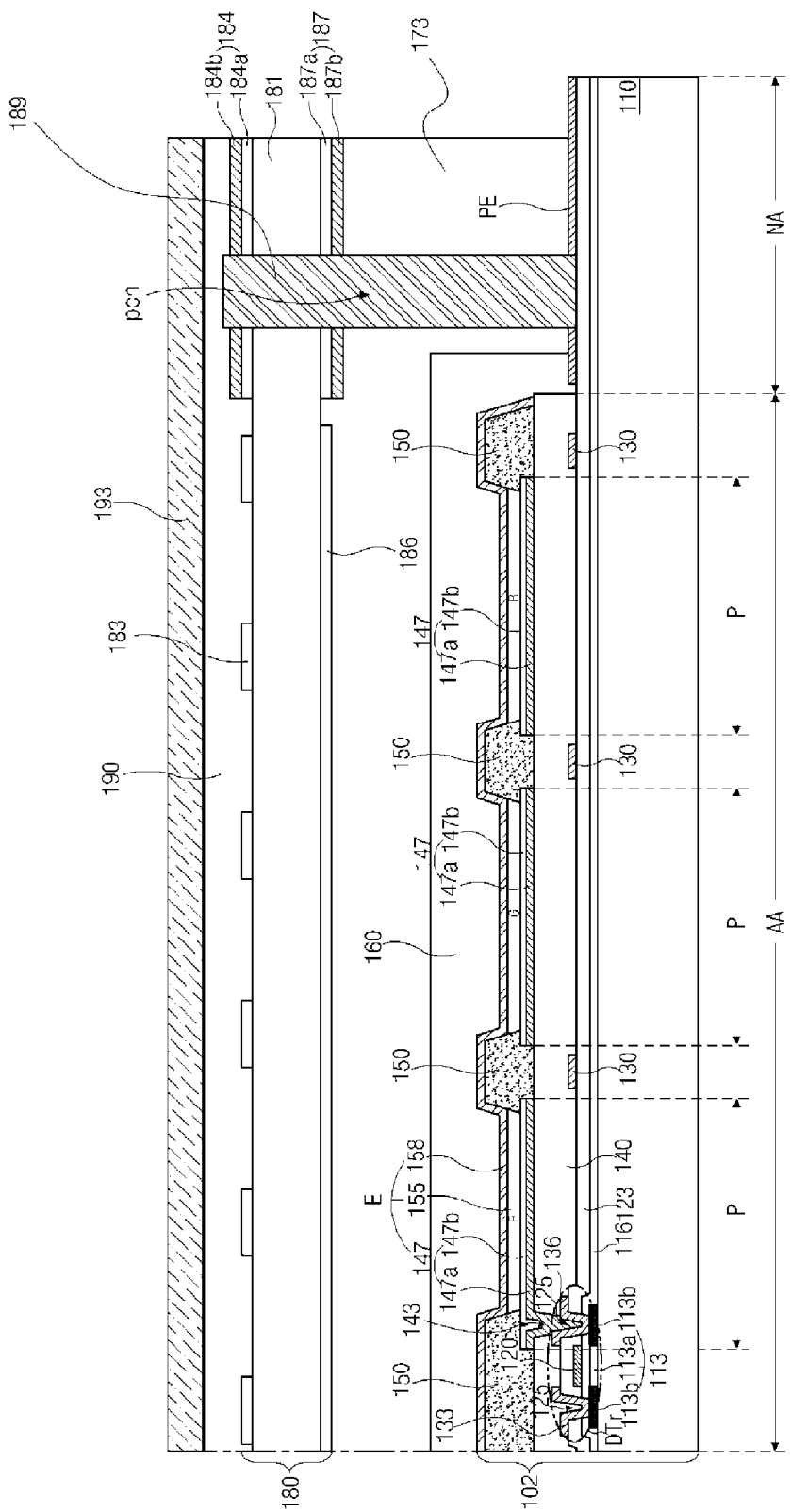
Figure 4G:
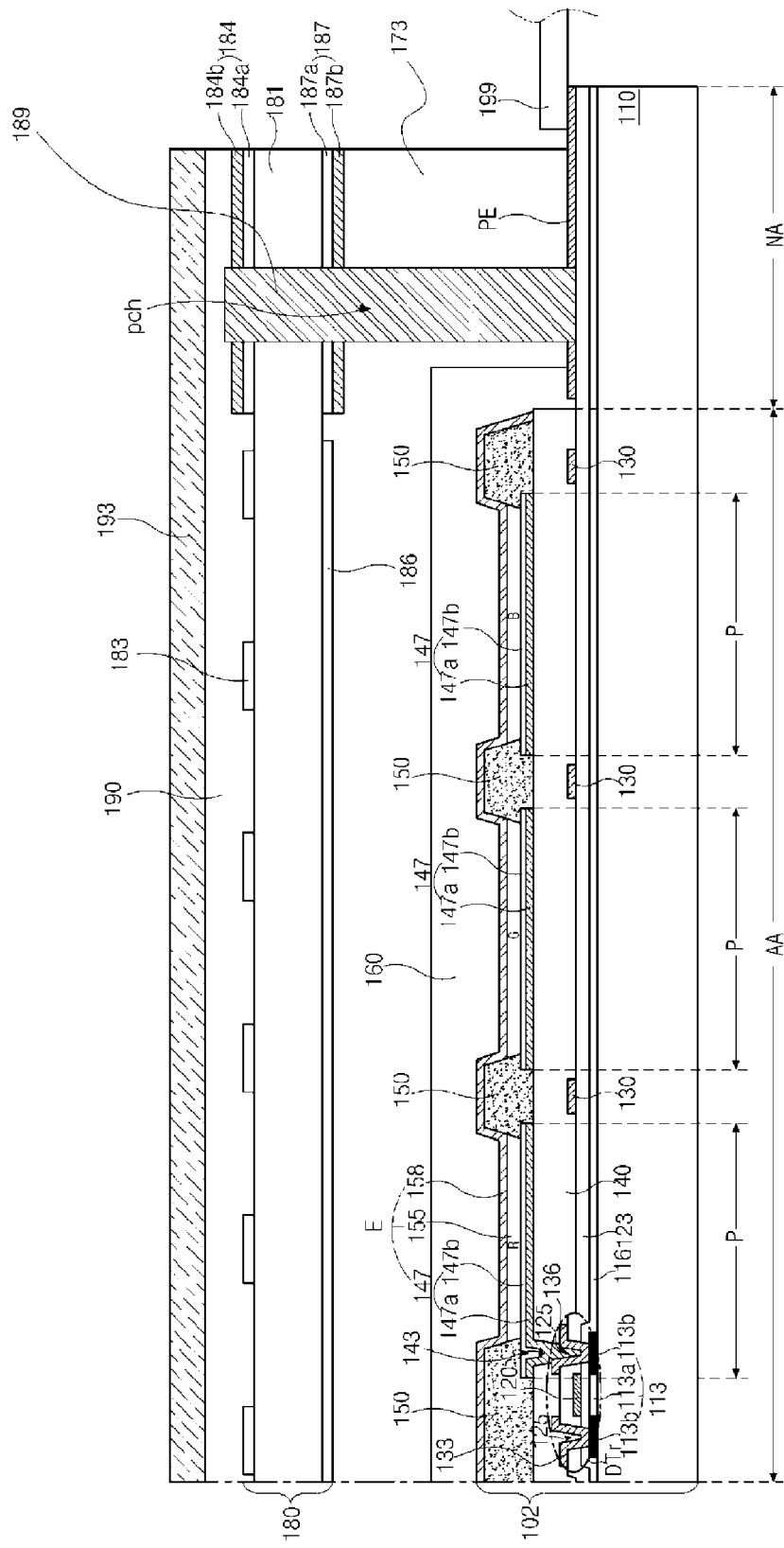

Portions of the first pads (not shown) and the second pads PE exposed by the first adhesive layer 173 are connected to the FPC connector 199 of FIG. 4G to electrically connect the external driving circuit board (not shown).

In FIG. 4D, a laser beam irradiation apparatus 250 is disposed over the touch screen 180 attached to the display panel 102, and a laser beam LB irradiates a portion of the touch screen 180 corresponding to the first touch pads 184 and the second touch pads (not shown) of the touch screen 180, thereby forming the pad contact holes pch. The pad contact holes pch may pass through the first touch pads 184, the second touch pads (not shown), the second substrate 181 of the touch screen 180, the first adhesive layer 173, and the second pads PE. The pad contact holes pch may further pass through the second auxiliary touch pads 187 with the first touch pads 184 and the first auxiliary touch pads (not shown) with the second touch pads (not shown). Alternatively, the pad contact holes pch may not pass through the second pads PE and may expose the top surfaces of the second pads PE.

The energy density, wavelength and pulse period of the laser beam LB depend on materials of the elements to be removed by the laser beam LB. The properties of the laser beam LB may be appropriately controlled.

For instance, when the second substrate 181 of the touch screen 180 is formed of polyimide, the laser beam LB may have a wavelength of 248 nm, an energy density of 1.6 to 1.8 J/cm$^2$, and a pulse period of 200 Hz. When the second substrate 181 is formed of glass, the laser beam LB may have a wavelength of 248 nm, an energy density of 40 to 50 J/cm$^2$, and a pulse period of 500 Hz.

In FIG. 4E, a metal paste is applied in each of the pad contact holes pch using a syringe (not shown) and is cured, thereby forming the conduction means 189. The conduction means 189 contacts and electrically connects the first touch pads 184, the second touch pads (not shown), and the second pads PE in each of the pad contact holes pch.

In FIG. 4F, the polarizing film 193 is attached to the outer surface of the touch screen 180 with the conduction means 189 of the metal paste in the pad contact holes pch via a second adhesive layer 190.

In FIG. 4G, the FPC connector 199 is mounted to contact the first pads (not shown) and the second pads PE exposed in the non-display area NA of the display panel 102, thereby completing the OLED display device 101 with a touch screen according to the first embodiment.

The touch screen 180 of the OLED display device 101 according to the first embodiment is an on-cell type.

In the OLED display device 101 with a touch screen according to the first embodiment, the first touch pads 184 and the second touch pads (not shown) of the touch screen 180 are electrically connected to the second pads PE of the display panel 102 through the conduction means 189 in the pad contact holes pch, and one FPC connector 199 is mounted. Accordingly, the number of components decreases.

Figure 5:
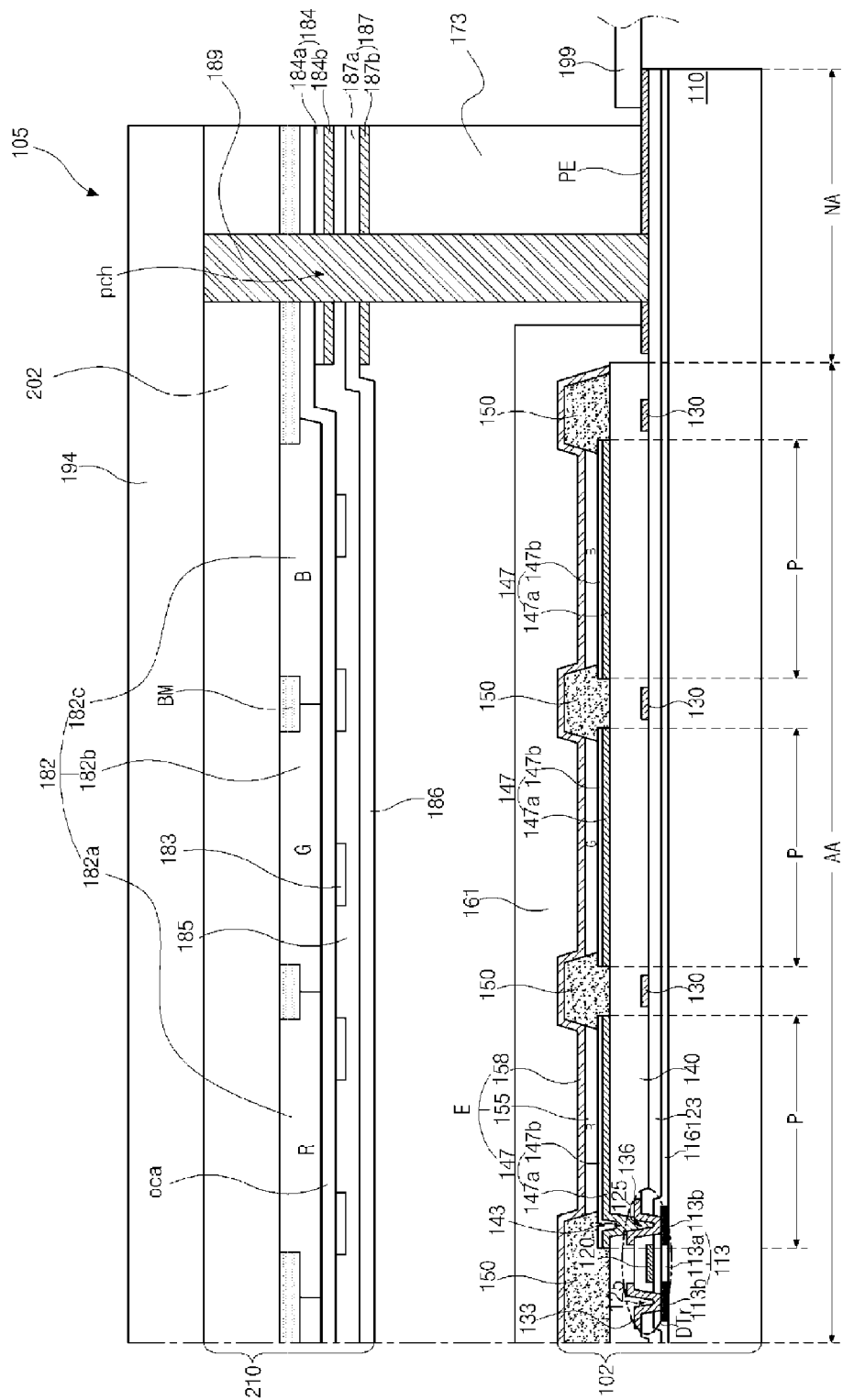
FIG. 5 is a cross-sectional view of an OLED display device with a touch screen according to a second embodiment of the present invention.

FIG. 5 is a cross-sectional view of an OLED display device 105 with a touch screen according to a second embodiment.

A touch screen of the OLED display device 105 according to the second embodiment is an in-cell type and is disposed on an inner surface of a substrate 202 of an encapsulation panel 210 opposite to a display panel 102 with organic light emitting diodes E. The encapsulation panel 210 includes a color filter layer 182.

In addition, the display panel 102 of the second embodiment has substantially the same structure as the display panel 102 of FIG. 2 of the first embodiment except that the organic light emitting diodes E of the display panel 102 according to the second embodiment emit white light and an organic light emitting layer 155 of the second embodiment is formed substantially all over a display area AA. Accordingly, explanation of the same parts as the display panel 102 of FIG. 2 of the first embodiment is omitted.

A black matrix BM is formed on the inner surface of the substrate 202 of the encapsulation panel 210 facing the display panel 102 and corresponds to each boundary between adjacent pixel regions P of the display panel 102. The color filter layer 182 is formed in the display area AA and includes red, green, and blue color filter patterns 182a, 182b, and 182c, which correspond to the pixel regions P surrounded by the black matrix BM, respectively, and which are sequentially and repeatedly disposed.

An overcoat layer oca covers the color filter layer 182, and first and second touch electrodes 183 and 186 are formed over the overcoat layer oca with an insulating layer 185 therebetween. Namely, the first touch electrodes 183 are formed on the overcoat layer oca, the insulating layer 185 is formed on the first touch electrodes 183, and the second touch electrodes 186 are formed on the insulating layer 185.

Additionally, first touch pads 184 and second touch pads (not shown) are formed in the non-display area NA of the encapsulation panel 210 and are connected to ends of the first touch electrodes 184 and the second touch electrodes 186, respectively.

In the figure, the first and second touch electrodes 183 and 186 are formed on different layers with an insulating layer 185 interposed therebetween. Alternatively, the first and second touch electrodes 183 and 186 may be formed on the same layer. Bridges (not shown) may be formed on a different layer from the first touch electrodes 183 or the second touch electrodes 186, and the first touch electrodes 183 or the second touch electrodes 186 may be connected to each other through the bridge (not shown) between adjacent ones.

The display panel 102 with the organic light emitting diodes E, the first pads (not shown), and the second pads PE is attached to the encapsulation panel 210 with the first and second touch electrodes 183 and 186, the first touch pads 184 connected to the first touch electrodes 183, and the second touch pads (not shown) connected to the second touch electrodes 186 by a first adhesive 173 such that the organic light emitting diodes E face the second touch electrodes 186.

Portions of the first pads (not shown) and the second pads PE are exposed by the first adhesive layer 173. Pads contact holes pch pass through the first pads (not shown), the second pads PE, and the first adhesive layer 173 from an outer surface of the substrate of the encapsulation panel 210 and expose the second pads PE. The pads contact holes pch also pass through the second pads PE and expose side surfaces of the second pads PE. Alternatively, the pads contact holes pch do not pass through the second pads PE and expose top surfaces of the second pads PE.

A metal paste is applied in the pad contact holes pch and is cured, thereby forming conduction means 189, which electrically connect the first touch pads 184 and the second touch pads (not shown) with the second pads PE.

An FPC connector 199 is mounted in the non-display area NA of the display panel 102 and contacts the first pads (not shown) and the second pads PE exposed by the first adhesive layer 173.

The OLED display device 105 with a touch screen according to the second embodiment further includes a cover glass 194 at an outer surface of the encapsulation panel 210.

The cover glass 194 may be omitted, and a polarizing film (not shown) may be disposed at the outer surface of the encapsulating panel 210 to prevent reflection due to external light and a decrease in image quality.

The OLED display device 105 with a touch screen according to the second embodiment has the same effects as the OLED display device 101 of FIG. 2 with a touch screen 180 according to the first embodiment.

FIGS. 6A to 6G are cross-sectional views of an OLED display device with a touch screen in steps of fabricating the display device according to the second embodiment.

Figure 6A:
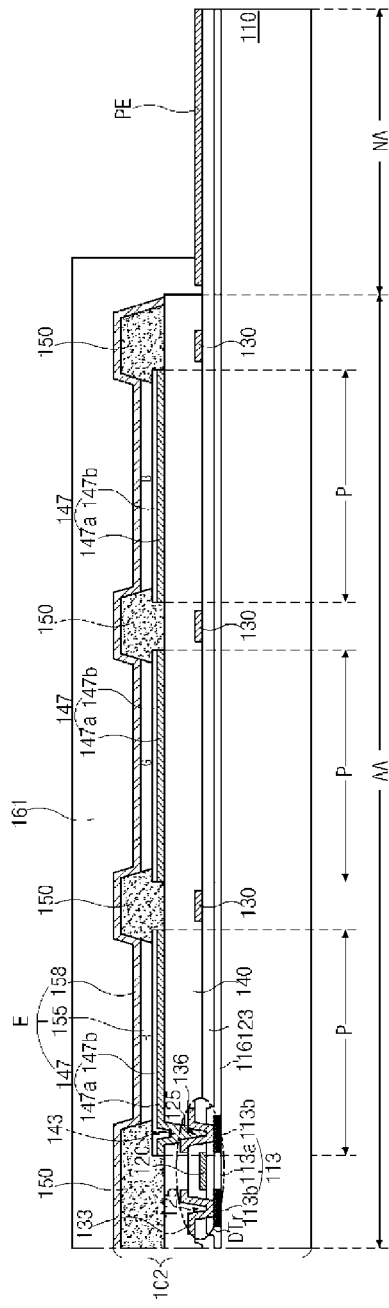
FIGS. 6A to 6G are cross-sectional views of an OLED display device with a touch screen in steps of fabricating the display device according to the second embodiment of the present invention.

In FIG. 6A, the gate lines (not shown) and the data lines 130 are formed over the first substrate 110 in the display area AA. The gate lines (not shown) and the data lines 130 cross each other to define the pixel regions P. The first substrate 110 may be formed of a transparent insulating material and may be a glass substrate or a plastic substrate, for example. The power supply lines (not shown) are also formed over the first substrate 110 in the display area AA and are parallel to the gate lines (not shown) or the data lines 130. The first pads (not shown) and the second pads PE are formed over the first substrate 110 in the non-display area NA. The first pads (not shown) are connected to ends of the gate lines (not shown), the data lines 130, and the power supply lines (not shown). The second pads PE are spaced apart from the first pads (not shown).

The switching thin film transistor (not shown) and the driving thin film transistor DTr are formed in each of the pixel regions P over the first substrate 110. The first electrode 147 connected to the drain electrode 136 of the driving thin film transistor DTr is formed in each of the pixel regions P over the first substrate 110, and the bank 150 overlapping edges of the first electrode 147 is formed on the first electrode 147. The organic light emitting layer 155 and the second electrode 158 are sequentially formed on the first electrode 147 exposed by the bank 150, thereby completing the display panel 102 according to the second embodiment. An encapsulation layer 161 having a multiple-layered structure, which includes inorganic layers and organic layers alternately disposed, is formed over the first substrate 110. The encapsulation layer 161 exposes the first pads (not shown) and the second pads PE. The display panel 102 may further include the encapsulation layer 161.

Figure 6B:
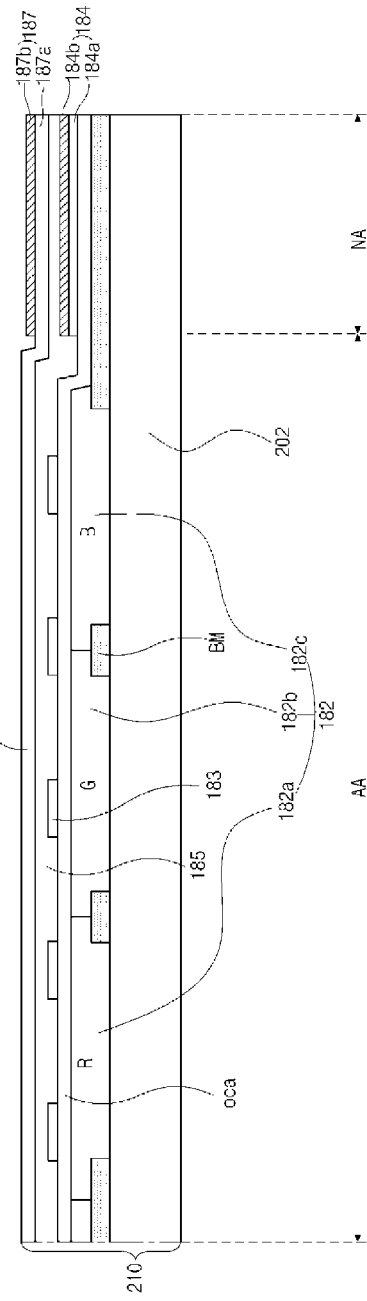

In FIG. 6B, the black matrix BM is formed on a first surface of a second substrate 202 in the display area AA, and the black matrix BM corresponds to each boundary between adjacent pixel regions P of the display panel 102. The black matrix BM is also formed on first surface of the second substrate 202 in the non-display area NA. The black matrix BM corresponds to substantially an entire area of the non-display area NA. The second substrate 202 may be formed of a transparent insulating material and may be a film type.

Then, the color filter layer 182 is formed on the first surface of the second substrate 202 in the display area AA. The color filter layer 182 includes red, green, and blue color filter patterns 182a, 182b, and 182c, which correspond to the pixel regions P surrounded by the black matrix BM, respectively, and which are sequentially and repeatedly disposed.

The overcoat layer oca is formed on the color filter layer 182.

The first touch electrodes 183 are formed on the overcoat layer oca. The first touch electrodes 183 extend in a first direction, for example, an x-axis direction, and are spaced apart from each other along a second direction, for example, a y-axis direction perpendicular to the x-axis direction.

The insulating layer 185 is formed on the first touch electrodes 183 substantially all over the display area AA, and the second touch electrodes 186 are formed on the insulating layer 185. The second touch electrodes 186 extend in the second direction, that is, the y-axis direction and are spaced apart from each other along the first direction, that is, the x-axis direction.

The first and second touch electrodes 183 and 186 may be formed of a transparent conductive material such as indium zinc oxide or indium tin oxide, for example.

The first touch pads 184 and the second touch pads (not shown) are formed over the first surface of the second substrate 202 in the non-display area NA, thereby completing the touch screen. The first touch pads 184 are connected to ends of the first touch electrodes 183, and the second touch pads (not shown) are connected to ends of the second touch electrodes 186. The first touch pads 184 may be formed simultaneously with the first touch electrodes 183, and the second touch pads (not shown) may be formed simultaneously with the second touch pads 186. Alternatively, the first touch pads 184 may be formed after forming the first touch electrodes 183, and the second touch pads (not shown) may be formed after forming the second touch electrodes 186.

Here, the first touch pads 184 and the second touch pads (not shown) may be formed of the same material as the first and second touch electrodes 183 and 186. Alternatively, the first touch pads 184 and the second touch pads (not shown) may be formed of a metallic material having relatively low resistivity and may include one or more of copper (Cu), aluminum (Al), aluminum alloy (e.g., AlNd), molybdenum (Mo), and molybdenum and titanium alloy (e.g., MoTi), for example. The first touch pads 184 may have a double-layered structure of a lower layer 184a and an upper layer 184b. The lower layer 184a may be formed of a transparent conductive material, and the upper layer 184b may be formed of a metallic material having relatively low resistivity. The second touch pads (not shown) also may have a double-layered structure of a lower layer and an upper layer.

In addition, first auxiliary touch pads (not shown) corresponding to the second touch pads (not shown) may be further formed on the same layer as the first touch pads 184, and the second auxiliary touch pads 187 corresponding to the first touch pads 184 may be further formed on the same layer as the second touch pads (not shown). The first auxiliary touch pads (not shown) may include the same material as and have the same structure as the first touch pads 184. The second auxiliary touch pads 187 may include the same material as and have the same structure as the second touch pads (not shown). The second auxiliary touch pads 187 may have a double layered structure of a lower layer 187a and an upper layer 187b.

Figure 6C:
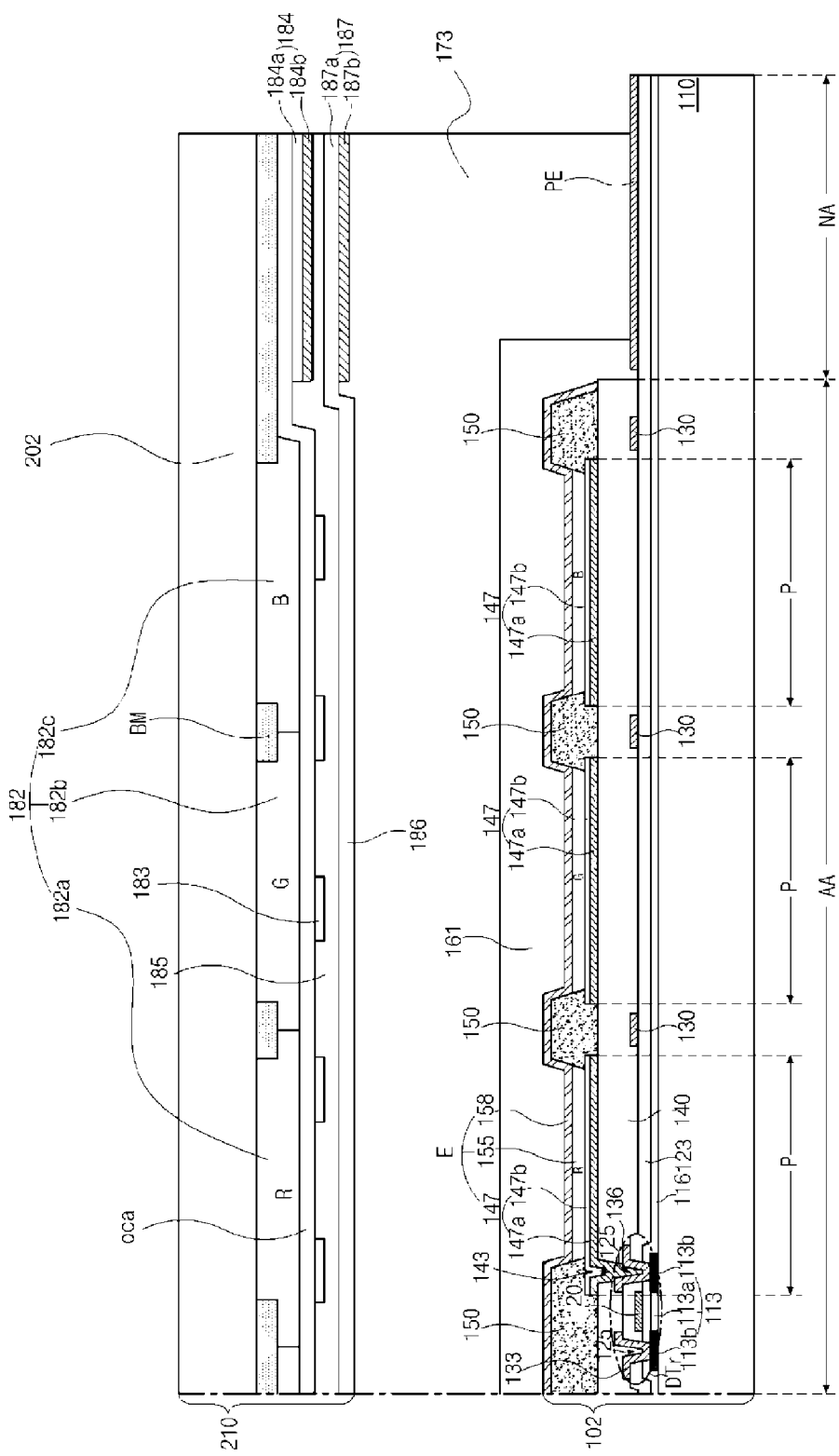

In FIG. 6C, the encapsulation panel 210 is disposed over the display panel 102 including the organic light emitting diodes E such that the organic light emitting diodes E and the second touch electrodes 186 face each other, and the encapsulation panel 210 is attached to the display panel 102 via the first adhesive layer 173.

The first adhesive layer 173 is disposed in the display area AA and part of the non-display area NA, and the first adhesive layer 173 partially exposes the first pads (not shown) and the second pads PE of the display panel 102.

Figure 6D:
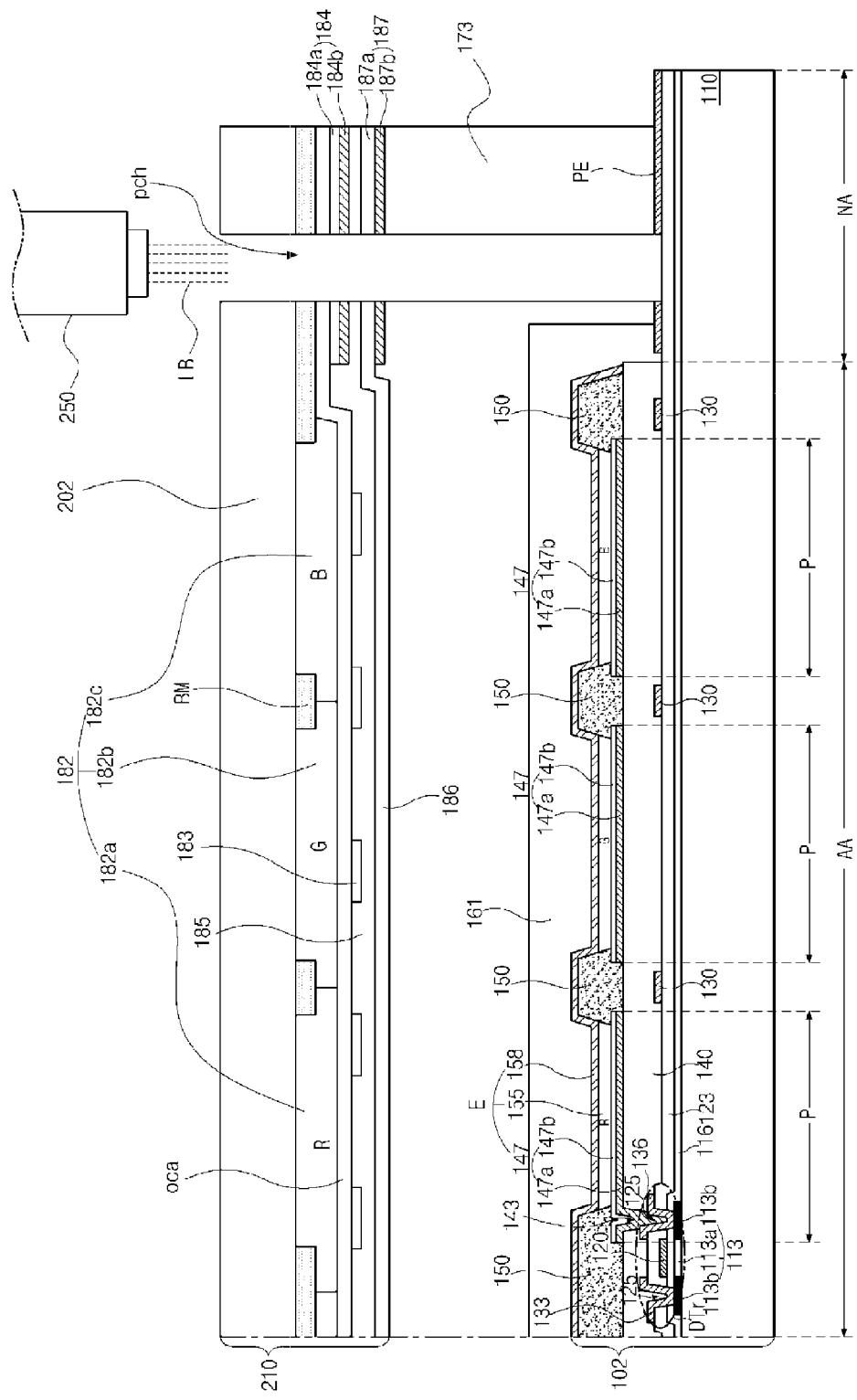
Figure 6E:
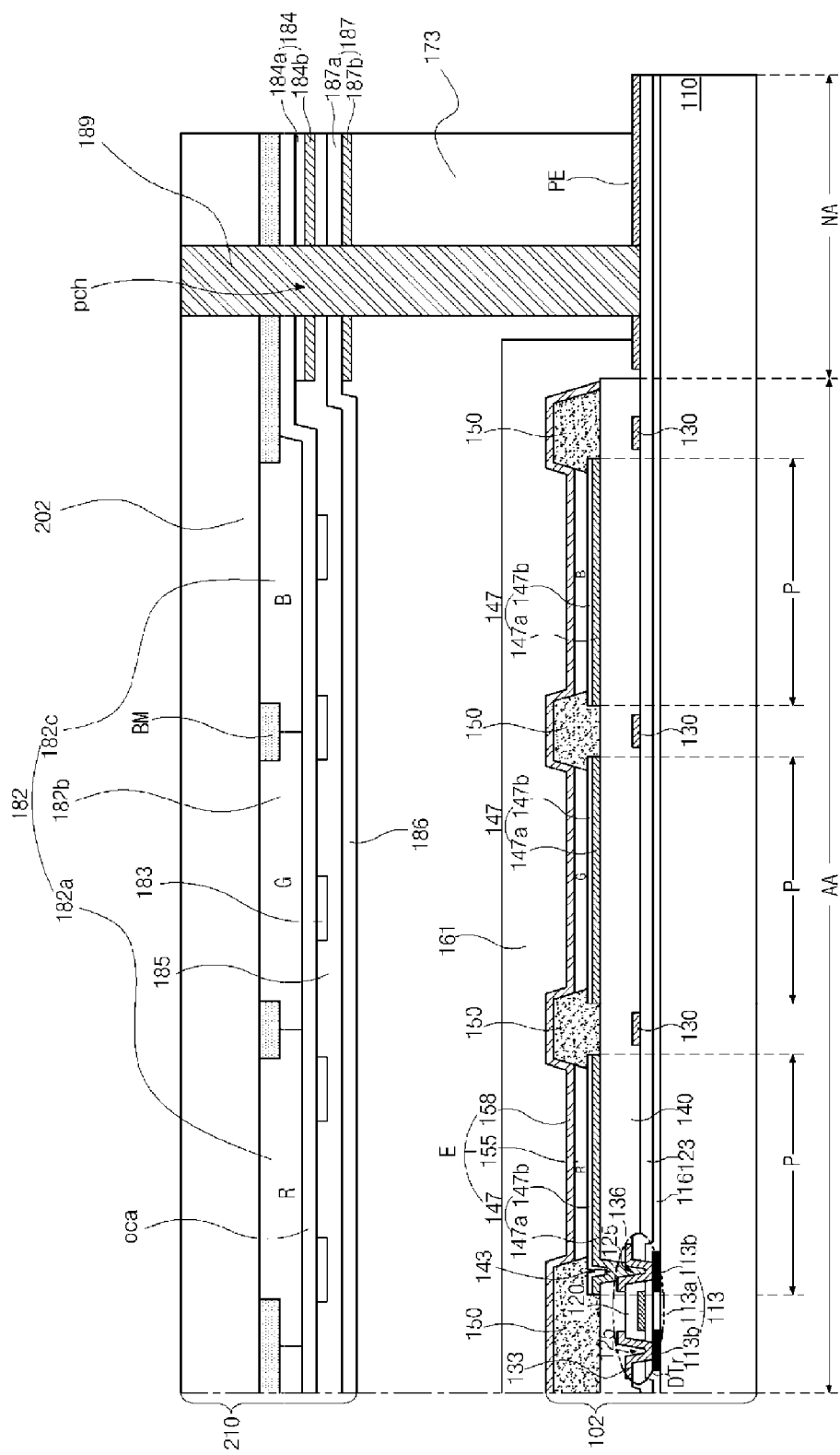
Figure 6F:
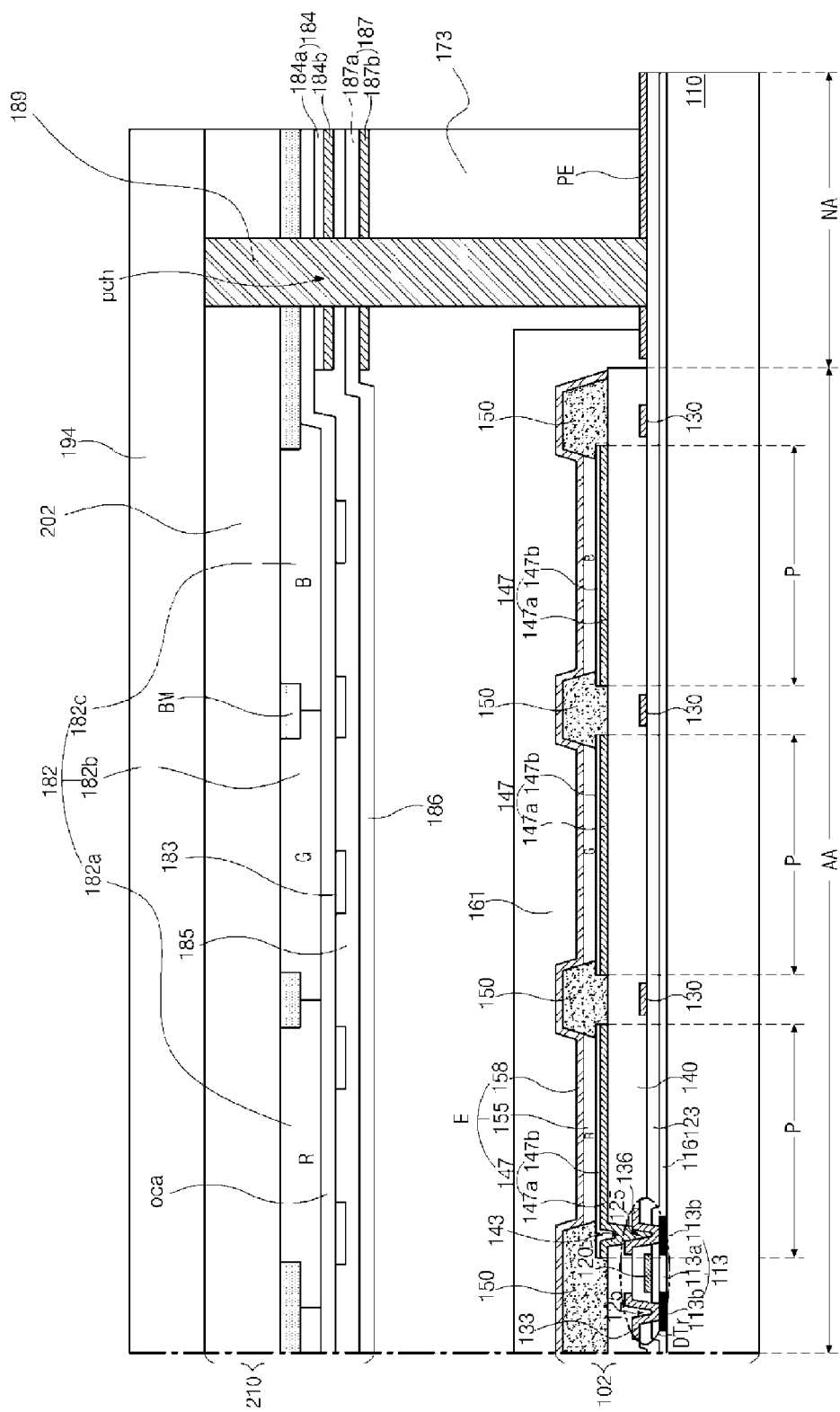
Figure 6G:
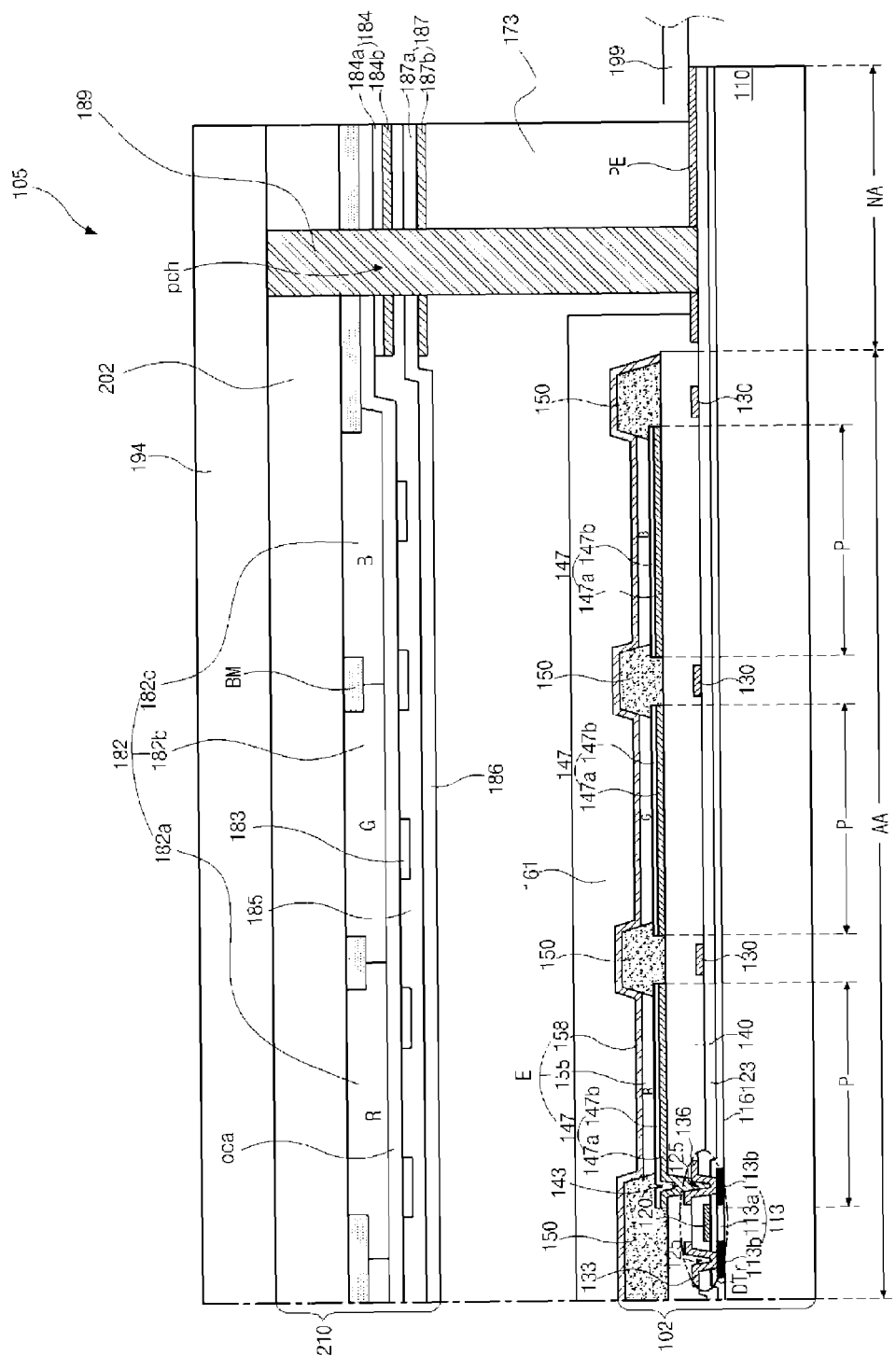

Portions of the first pads (not shown) and the second pads PE exposed by the first adhesive layer 173 are connected to the FPC connector 199 of FIG. 6G to electrically connect the external driving circuit board (not shown).

In FIG. 6D, a laser beam irradiation apparatus 250 is disposed over the encapsulation panel 210 attached to the display panel 102, and a laser beam LB irradiates a portion of the encapsulation panel 210 corresponding to the first touch pads 184 and the second touch pads (not shown) of the encapsulation panel 210, thereby forming the pad contact holes pch. The pad contact holes pch may pass through the second substrate 202, the first touch pads 184, the second touch pads (not shown), the first adhesive layer 173, and the second pads PE. The pad contact holes pch may further pass through the second auxiliary touch pads 187 with the first touch pads 184 or the first auxiliary touch pads (not shown) with the second touch pads (not shown). Alternatively, the pad contact holes pch may not pass through the second pads PE and may expose the top surfaces of the second pads PE.

In FIG. 6E, a metal paste is applied in each of the pad contact holes pch using a syringe (not shown) and is cured, thereby forming the conduction means 189. The conduction means 189 contacts and electrically connects the first touch pads 184, the second touch pads (not shown) and the second pads PE in each of the pad contact holes pch.

In FIG. 6F, the cover glass 194 or a polarizing film is attached to an outer surface of the encapsulation panel 210, that is, a second surface of the second substrate 202 with the conduction means 189 of the metal paste in the pad contact holes pch.

In FIG. 6G, the FPC connector 199 is mounted to contact the first pads (not shown) and the second pads PE exposed in the non-display area NA of the display panel 102, thereby completing the OLED display device 105 with a touch screen according to the second embodiment.

The OLED display device 105 with a touch screen according to the second embodiment includes an in-cell type touch screen.

In the OLED display device 105 with a touch screen according to the second embodiment, the first touch pads 184 and the second touch pads (not shown) of the encapsulation panel 210 are electrically connected to the second pads PE of the display panel 102 through the conduction means 189 in the pad contact holes pch, and one FPC connector 199 is mounted. Accordingly, the number of components decreases.

In the OLED display device with a touch screen according to the various embodiments, the display panel and the touch screen are driven through an FPC connector contacting the first and second pads of the display panel, and one FPC can be omitted as compared with the related art. The number of components decreases, and manufacturing costs are lowered. Therefore, a selling price can be reduced.

Moreover, since one FPC connector is used, freedom in design and arrangement, which should be considered to connect the FPC connector with an external driving circuit board, is improved.

Furthermore, a FPC connector of the touch screen is omitted, and the OLED display device with a touch screen has a light weight and a thin profile.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. An organic light emitting diode display device with a touch screen, comprising:
    first and second substrates where a display area including pixel regions and a non-display area at an outside of the display area are defined;
    organic light emitting diodes in the display area over the first substrate;
    first pads and second pads in the non-display area over the first substrate;
    first and second touch electrodes in the display area over the second substrate;
    touch pads in the non-display area over the second substrate and corresponding to and overlapping the second pads, respectively; and
    a first adhesive layer between the first and second substrates and exposing the first and second pads,
    wherein pad contact holes pass through the second substrate, the touch pads, and the first adhesive layer and expose the second pads, respectively, and
    wherein a conduction means is disposed in each of the pad contact holes and electrically connects each of the touch pads with a corresponding second pad.

2. The display device of claim 1, wherein the touch screen comprises the second substrate and the first and second touch electrodes.

3. The display device of claim 1, wherein a flexible printed circuit board connector is mounted to the first substrate in the non-display area and contacts the first and second pads.

4. The display device of claim 1, wherein the pad contact holes pass through the second pads.

5. The display device of claim 1, wherein the first touch electrodes cross the second touch electrodes.

6. The display device of claim 5, wherein the first touch electrodes are disposed over a first surface of the second substrate, and the second touch electrodes are disposed over a second surface of the second substrate.

7. The display device of claim 5, wherein the first touch electrodes and the second touch electrodes are disposed over a surface of the second substrate with an insulating layer interposed between the first touch electrodes and the second touch electrodes.

8. The display device of claim 1,
    wherein the touch pads include first touch pads connected to the first touch electrodes and second touch pads connected to the second touch electrodes, and
    wherein the first and second touch pads have a single-layered structure of a same material as the first and second touch electrodes or a double-layered structure including a lower layer of a same material as the first and second touch electrodes and an upper layer of a metallic material.

9. The display device of claim 1, further comprising an encapsulation layer having a multiple-layered structure or an encapsulation film on the organic light emitting diodes.

10. The display device of claim 1, further comprising a polarizing film or a cover glass at an outer surface of the second substrate with a second adhesive layer between the second substrate and the polarizing film or the cover glass.

11. The display device of claim 1, further comprising a color filter layer including red, green, and blue color filter patterns on an inner surface of the second substrate in the display area, wherein the red, green, and blue color filter patterns are sequentially and repeatedly disposed in the pixel regions, respectively, and the organic light emitting diodes emit white light.

12. The display device of claim 11, wherein the first and second touch electrodes are disposed over the color filter layer such that the color filter layer is interposed between the second substrate and the first and second touch electrodes.

13. The display device of claim 1, further comprising gate lines, data lines, and power supply lines in the display area over the first substrate, wherein the gate lines and the data lines cross each other to define the pixel regions, and the power supply lines are parallel to the gate lines or the data lines, and wherein the first pads are connected to the gate lines, the data lines, and the power supply lines, respectively.

14. The display device of claim 13, further comprising switching thin film transistors and driving thin film transistors in the pixel regions over the first substrate,
wherein the switching thin film transistors are connected to the gate lines and the data lines, and the driving thin film transistors are connected to the power supply lines, the switching thin film transistors, and the organic light emitting diodes.

15. A method of fabricating an organic light emitting diode display device with a touch screen, the method comprising:
forming organic light emitting diodes in a display area over a first substrate, the display area including pixel regions;
forming first pads and second pads in a non-display area over the first substrate, the non-display area disposed at an outside of the display area;
forming first and second touch electrodes in the display area and touch pads in the non-display area over a second substrate, the first and second touch electrodes crossing each other, and the touch pads connected to the first and second touch electrodes and corresponding to and overlapping the second pads, respectively;
attaching the first substrate and the second substrate with a first adhesive layer interposed therebetween, the first adhesive layer exposing the first and second pads;
forming pad contact holes by irradiating with a laser beam, the pad contact holes passing through the second substrate, the touch pads, and the first adhesive layer and exposing the second pads, respectively; and
forming a conduction means by applying and curing a metal paste in each of the pad contact holes, the conduction means electrically connecting each of the touch pads with a corresponding second pad.

16. The method of claim 15, further comprising a step of mounting a flexible printed circuit board connector to the first substrate in the non-display area, the flexible printed circuit board connector contacting the first and second pads.

17. The method of claim 15, wherein the pad contact holes pass through the second pads, and the conduction means contacts a side surface of one of the touch pads and a side surface of one of the second pads.

18. The method of claim 15, wherein the first touch electrodes are formed over a first surface of the second substrate, and the second touch electrodes are formed over a second surface of the second substrate.

19. The method of claim 15, wherein the first touch electrodes and the second touch electrodes are formed over a surface of the second substrate with an insulating layer interposed between the first touch electrodes and the second touch electrodes.

20. The method of claim 15, further comprising forming a color filter layer including red, green, and blue color filter patterns in the display area over the second substrate,
wherein the red, green, and blue color filter patterns are sequentially and repeatedly disposed in the pixel regions, respectively, and the organic light emitting diodes emit white light.

21. The method of claim 20, wherein the first and second touch electrodes are formed after forming the color filter layer.

22. The method of claim 15, further comprising:
forming gate lines, data lines, and power supply lines in the display area over the first substrate, wherein the gate lines and the data lines cross each other to define the pixel regions, and the power supply lines are parallel to the gate lines or the data lines, and wherein the first pads are connected to the gate lines, the data lines, and the power supply lines, respectively; and
forming switching thin film transistors and driving thin film transistors in the pixel regions,
wherein the switching thin film transistors are connected to the gate lines and the data lines, and the driving thin film transistors are connected to the power supply lines, the switching thin film transistors, and the organic light emitting diodes.

* * * * *